· US007695876B2

United States Patent
Ye et al.

(10) Patent No.: US 7,695,876 B2
(45) Date of Patent: Apr. 13, 2010

(54) METHOD FOR IDENTIFYING AND USING PROCESS WINDOW SIGNATURE PATTERNS FOR LITHOGRAPHY PROCESS CONTROL

(75) Inventors: Jun Ye, Palo Alto, CA (US); Moshe E. Preil, Sunnyvale, CA (US); Xun Chen, Palo Alto, CA (US); Shauh-Teh Juang, Saratoga, CA (US); James Wiley, Menlo Park, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 902 days.

(21) Appl. No.: 11/466,978

(22) Filed: Aug. 24, 2006

(65) Prior Publication Data

US 2007/0050749 A1    Mar. 1, 2007

Related U.S. Application Data

(60) Provisional application No. 60/713,123, filed on Aug. 31, 2005.

(51) Int. Cl.
*G03F 9/00*     (2006.01)
*G03C 5/00*    (2006.01)

(52) U.S. Cl. .................. 430/30; 382/145; 382/147; 382/149

(58) Field of Classification Search ............ 430/30; 382/145, 147, 149
See application file for complete search history.

(56) References Cited

U.S. PATENT DOCUMENTS

| 6,414,326 | B1 | 7/2002 | Nguyen |
| 6,429,930 | B1 | 8/2002 | Littau et al. |
| 6,643,596 | B2 | 11/2003 | Firth et al. |
| 6,673,638 | B1 | 1/2004 | Bendik et al. |
| 6,791,082 | B2 | 9/2004 | Komuro et al. |
| 6,795,163 | B2 | 9/2004 | Finders |
| 6,803,995 | B2 | 10/2004 | Ausschnitt |
| 6,909,930 | B2 | 6/2005 | Shishido et al. |
| 6,913,861 | B2 | 7/2005 | Shishido et al. |
| 6,929,892 | B2 | 8/2005 | Shishido et al. |
| 2002/0051567 | A1 | 5/2002 | Ganz et al. |
| 2004/0190008 | A1 | 9/2004 | Mieher et al. |
| 2004/0223137 | A1 | 11/2004 | Littau et al. |

OTHER PUBLICATIONS

Allgair et al. "Characterization of Optical Proximity Correction Features" Proc. SPIE vol. 4344, pp. 200-207 (2001).
T. Brunner et al. "Impact of Resist Blur on MEF, OPC, and CD Control" Proc. SPIE vol. 5377, pp. 141-149 (2004).
H.J. Levinson "Lithography Process Contol" SPIE Optical Engineering Press, Bellingham, WA, vol. TT28, ISBN 0-8194-3052-8 (1999).
V.N. Mahajan "Aberration Theory Made Simple" SPIE Optical Engineering Press, Bellingham, WA, vol. TT06, ISBN 0-8194-0536-1 (1991).
V. Wiaux "Assessment of OPC Effectiveness Using Two-Dimensional Metrics," Proc. SPIE, vol. 4691, pp. 395-406 (2002).
A.K.K. Wong "Resolution Enhancement Techniques in Optical Lithography" SPIE Press, Bellingham, WA, vol. TT47, ISBN 0-8194-3995-9 (2001).

*Primary Examiner*—Christopher G Young
(74) *Attorney, Agent, or Firm*—Pillsbury Winthrop Shaw Pittman LLP

(57) ABSTRACT

A method for identifying process window signature patterns in a device area of a mask is disclosed. The signature patterns collectively provide a unique response to changes in a set of process condition parameters to the lithography process. The signature patterns enable monitoring of associated process condition parameters for signs of process drift, analyzing of the process condition parameters to determine which are limiting and affecting the chip yields, analyzing the changes in the process condition parameters to determine the corrections that should be fed back into the lithography process or forwarded to an etch process, identifying specific masks that do not transfer the intended pattern to wafers as intended, and identifying groups of masks that share common characteristics and behave in a similar manner with respect to changes in process condition parameters when transferring the pattern to the wafer.

26 Claims, 10 Drawing Sheets

Illumination Optics    Projection Optics

|  | Process Condition Parameter 1 | Process Condition Parameter 2 | Process Condition Parameter 3 | Process Condition Parameter 4 |
| --- | --- | --- | --- | --- |
| Pattern-Metric Pair 1 | 1 | 0 | 0 | 0 |
| Pattern-Metric Pair 2 | 0 | -1 | 0 | 0 |
| Pattern-Metric Pair 3 | 0 | 0 | 2 | 0 |
| Pattern-Metric Pair 4 | 0 | 0 | 0 | -0.5 |

FIG. 7

|  | Process Condition Parameter 1 | Process Condition Parameter 2 | Process Condition Parameter 3 | Process Condition Parameter 4 |
| --- | --- | --- | --- | --- |
| Pattern-Metric Pair 1 | 1 | 0 | 0 | 0 |
| Pattern-Metric Pair 2 | 0 | -1 | 0 | 0 |
| Pattern-Metric Pair 3 | -1 | 0 | 2 | 0 |
| Pattern-Metric Pair 4 | 0 | 1 | 0 | -0.5 |

FIG. 8

METHOD FOR IDENTIFYING AND USING PROCESS WINDOW SIGNATURE PATTERNS FOR LITHOGRAPHY PROCESS CONTROL

CROSS-REFERENCE TO RELATED APPLICATION

This application claims the benefit of U.S. Provisional Application No. 60/713,123, entitled "System and Method for Lithography Process Control." The subject matter of the related application is hereby incorporated by reference.

FIELD OF THE INVENTION

This invention relates generally to lithography processes and relates more particularly to a method for identifying process window signature patterns for lithography process control.

BACKGROUND

In the semiconductor industry, microlithography (or simply lithography) is the process of printing the circuit patterns on a semiconductor wafer (for example, a silicon or gallium arsenide wafer). Currently, optical lithography is the predominant technology used in volume semiconductor manufacturing. Optical lithography employs light in the visible to deep ultraviolet spectrum range to expose the resist on a wafer. In the future, extreme ultraviolet (EUV) and soft x-rays may be employed. Following exposure, the resist is developed to yield a relief image.

In optical lithography, a photomask (often called a mask or a reticle) is first written using electron-beam or laser-beam direct-write tools. A typical mask for optical lithography consists of a glass (or quartz) plate of six to eight inches on a side, with one surface coated with a thin metal layer (for example, chrome) of a thickness of about 100 nm. The chip pattern is etched into the metal layer, hence allowing light to transmit through. The area where the metal layer is not etched away blocks light transmission. In this way, a pattern may be projected onto a semiconductor wafer.

The mask contains certain patterns and features that are used to create desired circuit patterns on a wafer. The tool used in projecting the mask image onto a wafer is called a stepper or scanner (hereinafter collectively called "exposure tool"). FIG. 1 is a block diagram of an optical projection lithographic system 10 of a conventional stepper including an illumination source 12, an illumination pupil filter 14, a lens subsystem 16a-c, a mask 18, a projection pupil filter 20, and a wafer 22 on which the aerial image of mask 18 is projected.

Illumination source 12 may be laser source operated, for example, at UV (ultra-violet) or DUV (deep ultra-violet) wavelengths. The light beam is expanded and scrambled before it is incident on illumination pupil 14. Illumination pupil 14 may be a simple round aperture, or have specifically designed shapes for off-axis illumination. Off-axis illumination may include, for example, annular illumination (i.e., the pupil is a ring with a designed inner and outer radius), quadruple illumination (i.e., the pupil has four openings in the four quadrant of the pupil plane), and other shapes like dipole illumination.

After illumination pupil 14, the light passes through the illumination optics (for example, lens subsystem 16a) and is incident on mask 18. Mask 18 contains the circuit pattern to be imaged on wafer 22 by the projection optics. As the desired pattern size on wafer 22 becomes smaller and smaller, and those patterns becomes closer and closer to each other, the lithography process becomes more challenging. In an effort to improve imaging quality, current processing techniques employ resolution enhancement technologies ("RET"), such as, for example, optical proximity correction ("OPC"), phase shift masks ("PSM"), off-axis illumination ("OAI"), condenser and exit pupil filters, and so on.

Many of the RET technologies are applied on or directly to mask 18. For example, OPC and PSM, which modify the light wave to (1) compensate for the imperfection of the imaging property of the projection optics, for example, the OPC technology is used to compensate the optical proximity effect due to light interference, and/or (2) take advantage of designed light interferences to enhance the imaging quality, for example, the phase shift mask technology is used to create phase shifting between neighboring patterns to enhance resolution.

Notably, mask 18 may not be "perfect" due to its own manufacturing process. For example, corners on mask 18 may not be sharp but may be rounded and/or the linewidth may have a bias from design value where the bias may also depend on the designed linewidth value and neighboring patterns. These imperfections on mask 18 may affect the final imaging quality.

The projection optics (for example, lens subsystems 16b and 16c, and projection pupil filter 20) images mask 18 onto wafer 22. In this regard, the projection optics includes a projection pupil filter 20. Projection pupil filter 20 limits the maximum spatial frequency of the mask pattern that can be passed through the projection optics. A number called "numerical aperture" or NA often characterizes projection pupil filter 20. There are also proposed RET techniques that modify projection pupil filter 20, which is generally called pupil filtering. Pupil filtering may include modulation for both the amplitude and the phase on the passing light beams.

Due to the wavelength of light being finite, and current techniques employing wavelengths that are larger than the minimum linewidth that is printed on wafer 22, there are typically significant light interference and diffractions during the imaging process. The imaging process is not a perfect replication of the pattern on mask 18. Current techniques employ physical theory to model this imaging process. Further, due to the high NA value of current exposure tools, different polarizations of the light provide different imaging properties. To more accurately model the lithography process, a vector-based model may be used.

The projection optics may be diffraction-limited. However, lens subsystem 16b and 16c in the projection optics are most often not completely "perfect." These imperfections may be modeled as aberrations, which are often abstracted as some undesired phase modulation at the plane of projection pupil filter 20, and are often represented by a set of Zernike coefficients. After the light finally reaches the surface of wafer 22, they will further interact with the coatings on wafer 22 (for example, the photo-resist). In this regard, different resist thickness, different optical properties of the resist (for example, its refractive index), and different material stack under the resist (for example, bottom-anti-reflection-coating or BARC), may further affect the imaging characteristics. Some of these effects may also be abstracted by a modulation at the pupil plane.

When the resist is exposed by the aerial image and thereafter baked and developed, the resist tends to undergo complex chemical and physical changes. First principle and empirical models have been developed to simulate these processes.

When wafers are printed using an exposure tool, ideally, wafer 22 should be placed exactly at the focal plane of the projection optics, or a designated location away from the focal plane. However, due to the imperfect mechanical control of exposure tools, there is always a small deviation between the designated plane and the actual wafer plane. That deviation is called defocus, or sometimes just called "focus," and represented by a distance unit, e.g., 50 nm. The defocus introduces additional imperfections in the imaging path, and can also be characterized by a phase modulation at the pupil plane.

Furthermore, all wafers, and dice on the wafers, are ideally exposed by a designated amount of exposure dose, e.g., 20 mJ/cm$^2$. However, due to the imperfections in the illumination control and changes in the reflectivity and uniformity of the film stacks on the wafers being patterned, there is always a small deviation between the ideal exposure dose and the actual exposure dose deposited on a die. That deviation is called exposure dose variation, or sometimes just called "exposure," and is represented by a percentage deviation from the ideal exposure dose, e.g., 10%.

The combination of focus and exposure errors means that the dimensions of the wafer features that are patterned may not match exactly with the dimensions required by the design. Since every structure responds differently to focus and exposure errors in different ways depending on the width, shape, and local environment of the specific structure, it is not possible to describe the response of every individual structure in a circuit pattern with a limited set of figures of merit.

In practice, the most common metric used to characterize a lithography process is the width of the smallest features being patterned on a given process layer for a given technology. This minimum dimension is referred to as the "critical dimension" or CD. While critical dimensions are actually intended to represent the three dimensional resist profile, the term CD is usually associated with a one-dimensional slice through the resist line, also referred to as the linewidth. In a looser definition, the term CD is often used to refer to any linewidth measurement even if it is not the minimum dimension on the device.

Under a certain lithographic setting (e.g., exposure tool, wavelength, NA, and so on), the amount of defocus and exposure dose variations that a circuit design can tolerate, while still producing functional chips, is called the design's "process window." The process window is often characterized as an area or region in the two-dimensional F-E plot, where "F" is defocus, and "E" is exposure dose variation. Such a plot may also be referred to as an "ED tree", so-called because of the tree-shaped process window which results when exposure (E) is plotted on the x-axis and defocus (D) is plotted on the y-axis. Some RET techniques (e.g., PSM, scattering bars in OPC, OAI) can enhance the process window for a certain circuit design. The settings of the exposure tool (e.g., NA) also have a big impact on the process window.

FIG. 2 shows one example of a process window 30 in the F-E plane. When a wafer is exposed in a F-E condition within process window 30, the chips made from dice on that wafer will be functional. When the wafer is exposed in a F-E condition outside process window 30, the chips from the wafer will not be functional. The larger process window 30, the more robust the circuit design is, and will have higher yield in manufacturing.

A process window for a lithography process is further limited because different patterns within a circuit design have different process windows. These differences may include shifts in the best focal plane position, shifts in the best exposure, and changes in the allowed range of focus and exposure. Different patterns also have different criteria for successful printing. While CD variation of up to +/−15% may be tolerable for some non-critical features, the tolerance for the most critical structures may be only half as much. The failure modes of different patterns may also be very different. Some patterns may be considered unacceptable due to excessive CD variation, others due to excessive changes in their sidewall profiles, and others may suffer from excessive line end pullback or corner rounding. Catastrophic pattern failures are also possible due to the interaction of neighboring structures. A CD variation that may be acceptable if a given feature were being printed as an isolated structure might cause bridging, necking, or other unacceptable pattern variations in a different local environment.

The ultimate goal of the lithography process is to deliver a robust and well maintained "common process window," that is, a process window in which every feature prints within specifications. An example of the overlapping of multiple process windows for individual structures leading to a common process window is shown in FIG. 3. The more different types of structures one desires to print with acceptable pattern fidelity in a single exposure, the more individual process windows need to overlap successfully and the tighter the overlapping common process window usually becomes. This common process window may also be plotted as a series of overlapping ED trees, and has been referred to in the literature as an "ED forest."

OPC is one of a number of techniques available to lithography process designers to optimize the process window overlap between all critical features by adjusting the mask level pattern so that, in principle, all patterns are reproduced at the desired wafer dimensions and shapes under a common set of focus and exposure conditions. However, due to the complex non-linear nature of the pattern transfer process, OPC remains a difficult technique to implement, test, and insert into production with the assurance that all features of interest are correctly transferred from mask to wafer in a manufacturing fab. It is particularly difficult to determine which limited set of structures should be measured and tracked on a regular basis to guarantee that all of the structures in the circuit design are printed correctly.

The definition of common process window used to this point has been phrased in terms of CD performance as the sole metric of process capability. In fact, the common process window for a viable process must be such that the entire three-dimensional pattern is replicated faithfully, including the sidewall profile and height of the remaining resist pattern after development. A complete, common process window would insure that the CD, sidewall angle (SWA), and resist loss (RL) during development are all within specifications for all structures in the circuit layer being patterned. In practice, the process window is often defined only in terms of the CD. A typical process window may be defined as the region of the F-E plane over which the critical dimensions are patterned within specified tolerances, such as +/−10% of the nominal target dimension.

In addition to focus and exposure, many other parameters can have an adverse impact on the common process window, including, but not limited to, lens aberrations (Zernike aberrations, scattered light, and other mid- to long-range spatial frequency errors), imperfections in the exposure tool illumination system (uniformity, localized partial coherence, and localized variations in pupil filling), and less than optimal optical proximity corrections. (See Wong, "Resolution Enhancement Techniques in Optical Lithography," SPIE Press, Bellingham, Washington, Volume TT47, ISBN 0-8194-3995-9 (2001), and Mahajan, "Aberration Theory Made Simple," SPIE Press, Bellingham, Washington, Volume TT06, ISBN 0-8194-0536-1 (1991)).

A typical integrated circuit device contains between 100 million to several billion structures, and there are typically several hundred devices or chips on a typical silicon substrate with a diameter of 200 or 300 mm. It is clearly impossible to measure the dimensions of every structure on a single device, and even more so to measure every device on every production wafer. In practice, a limited set of structures is defined, either within the device areas or placed in the scribe lines between device areas, for in-process monitoring and control.

One of the most difficult challenges in implementing complex OPC into production, such as leading edge model-based OPC, is the difficulty in determining which limited set of structures should be measured and tracked on a regular basis to guarantee that all of the structures in the circuit design are printed correctly. Since all patterns respond differently to changes in focus, exposure, and other process variables, a test structure that is sensitive to one parameter that must be monitored and controlled may be insensitive to other critical parameters. Thus, even if the process monitors seems to indicate that the process is in control, other patterns which are critical to the proper operation of the device may drift without being detected by the metrology plan of record. Insuring that all of the critical parameters are adequately monitored and controlled is a growing challenge in integrated circuit manufacturing.

In today's wafer fabs, exposure tool related optical conditions such as focus, exposure, illumination and aberration may be monitored using test masks and test wafers using specially designed test patterns, or by an exposure tool's self-metrology while undergoing maintenance checks. The optical analysis in these approaches is not in-situ, i.e., the extracted optical conditions are not present when product wafers are printed. Therefore the use of these data is limited.

It is also possible to use test patterns in the product mask's scribe lines, i.e., the spaces between the device areas, to print test patterns, and analyze the test patterns in the scribe lines to extract the optical conditions when the wafer is printed. This approach will take up the valuable space in the scribe lines, where many other patterns are needed, for example alignment patterns. Furthermore, this approach cannot analyze the optical conditions inside the device design itself.

In practice, a limited set of test structures is defined, either within the device areas or placed in the scribe lines between the device areas, for in-process metrology and process control. The dimensions of these test structures are usually chosen to be at or near the minimum feature size that will be patterned within the device, and are referred to as "the CD" of the layer being patterned regardless of whether the width of the structures being measured is actually the minimum or most critical dimension in the device.

The CD is intended to be measured as near as possible to the base of the three-dimensional resist structure, that is, at the resist-substrate interface, to assure the optimum feature size for subsequent process steps such as etch, film deposition, polishing, and ion implantation. This is often difficult due to the top-down viewing angle of scanning electron microscopes used for CD metrology (CD-SEMs) and the high aspect ratio of the three-dimensional profiles, which typically approach 3:1 (3 units depth in the z-direction for every one unit of width in the x-y plane). Scatterometry (SCD) and tilt-SEMs are intended to help resolve this problem and may be used to determine metrics of resist profile and resist loss in addition to CD, but they suffer from other sources of error and uncertainty as well. While it is possible to obtain a reasonable approximation of the CD at the resist-substrate interface for the specified test structures when the process is very close to optimal, the uncertainty in the true CD increases as the process drifts away from the optimal settings.

CD data from multiple test structures with different geometries may be collected in an effort to more closely monitor the common process window of the entire pattern transfer process. While this comes closer to monitoring the full process than simply measuring a single type of test structure, it falls far short of the ultimate goal of representing the performance of all patterns and structures within the device, including the effects of the local environment on the dimensional stability of each pattern. In addition, a full characterization of the common process window would need to take into account the full three-dimensional shape of the metrology patterns, including sidewall angle, sidewall curvature, or other deviations from an idealized trapezoidal shape, and the height of the pattern indicating resist loss from the top of the three-dimensional structure.

The non-linear manner in which each different structure responds to its own local environment and to the global changes in optical and other process conditions throughout the pattern transfer process from mask to wafer creates a complex manufacturing environment where it is difficult to determine, from a limited number of measurements, whether or not all of the desired features within the device are printed within specification, and whether or not all of the variable process condition parameters are being maintained at or near their optimum operating points. This leads to several related problems:

(1) The limited amount of metrology data and test structures cannot adequately ensure that the CDs across the device are within specifications and that the entire device will operate as intended. Since typical manufacturing cycle times can take several months, it is extremely disruptive to the entire business when a large number of wafers turn out to have unacceptably low yield of devices that work properly, requiring new lots to be started and deliveries to be substantially more expensive and behind schedule.

(2) Even when a variation in CD performance is detected, the proper corrective action to take is often unclear due to the confounding influences of focus, exposure, and other process conditions. Historically the easiest adjustment to make has been the exposure dose (See Levinson, "Lithography Process Control," SPIE press, Bellingham, Washington, Vol. TT28, ISBN 0-8194-3052-8 (1999)). However, this blind correction, that is, using only a single adjustable parameter to force a desired output on a limited set of data regardless of which of many parameters actually caused the process to deviate in the first place, often means that the root cause of the CD variation remains undetected and incorrectly compensated.

(3) If the process variation of the test structures was caused by a drift or shift in other parameters besides exposure, a simple exposure compensation or other blind adjustment may be adequate to correct the CD of the test structures, but not of all structures within the device, which could result in the final devices having reduced functionality and yield.

(4) Although crude correction such as a blind exposure dose adjustment may bring the metrology target CDs back into specification, if the error was in fact caused by a focus drift or other optical error instead of an exposure drift, the resulting resist profiles will not have the correct sidewalls intended for the process. Thus, when the wafers are etched, the final profile of the resulting etched structure may be incorrect, leading to improper circuit operation and device failure.

(5) Even if the wafers in question are adequately corrected by a simple dose or other blind correction, other wafers that are to be patterned with other device layouts may be patterned incorrectly with the same relative correction. Thus, by changing the only one parameter to compensate for drifts in other parameters, the process control algorithms for the entire production line may become unstable.

(6) Even if the process can be adequately corrected with a global adjustment of the exposure dose or some other blind correction, if the underlying source of the process variation is not correctly identified and corrected, it may continue to drift further until no amount of compensation of a single parameter can recover the desired process outputs. At that point, the orderly flow of wafers through the entire process line may be disrupted as CDs begin to fall outside the specification limits and the root cause analysis of the true source of the variation must be initiated at great cost and disruption to the manufacturing environment.

Many different approaches have been developed to try to improve CD monitoring and control systems. In particular, a number of techniques have been disclosed to try to separate out the influences of focus and exposure to solve some of the problems listed above. While some of these methods are partially successful, they all suffer from drawbacks in terms of metrology calibration and/or requirements for extensive test structures that do not adequately represent the circuit features. In addition, they are limited to focus and exposure only and do not include other optical parameters of interest. Many of these techniques require extensive metrology and test structure calibration and cannot be easily adapted to changes in circuit design and/or process targets.

U.S. Pat. No. 6,414,326 to Nguyen discloses a simple method to deconvolve focus and exposure errors by measuring two different test structures, one with an isolated pitch and the other with a dense pitch. Since these pitches respond differently to focus and exposure, a given combination of CD errors for the respective patterns should correspond to a unique set of focus and exposure errors. Like many similar efforts, this approach still suffers from an ambiguity in the sign of the focus error: a given combination of isolated and dense CD errors could be due to a focus shift of a given magnitude but in either the positive or negative direction. Nguyen teaches a possible solution using astigmatism of the lens to differentiate between the two focus directions for vertically vs. horizontally oriented features, but this requires extensive characterization of lens astigmatism across the field which may also be convolved with other lens parameters.

U.S. Pat. No. 6,673,638 to Benkik et al. discloses a system for creating line end test structures that are modified to print in a deliberately defocused state even when the exposure tool is at best focus. A comparison between differently modified structures can uniquely determine dose and focus errors; the sign ambiguity of the focus can be solved by printing features of opposite polarity (lines and spaces). This approach is restricted to special targets in the scribe line, not actual device geometries, and depends on line end metrology, which is less precise and more susceptible to convolution with other optical aberrations than line width (CD) measurements.

U.S. Pat. No. 6,929,892 to Shishido et al. discloses the use of an SEM with tilt capability or scatterometry to determine the sidewall profile of a highly isolated feature, which is known to be more susceptible to focus-induced variations than dense structures. The ambiguity in the sign of the focus error is said to be resolved by measuring isolated structures of opposite polarity. Like U.S. Pat. No. 6,673,638, this approach is limited to scribe line test structures, not actual device geometries, and the focus sensitive isolated structures are also sensitive to other aberrations.

U.S. Pat. No. 6,803,995 to Auschnitt discloses a focus control system using special scribe line patterns wherein line end shortening of the segments of a long pattern ("schnitzl") can be imaged as line width changes in an optical measuring system. The effects of focus and exposure can be deconvolved using targets of opposite polarity, but the sign ambiguity of the best focus position can only be resolved by exposing some fields on the wafer at deliberately defocused conditions, resulting in potential lost chips and complicated exposure and metrology schemes. U.S. Pat. No. 6,643,596 to Firth et al. also discloses a system of deliberately inducing focus perturbations on a lot-by-lot basis to update a focus model. This results in better focus metrology at the expense of negatively impacting the CD control of each lot processed at less than optimal focus.

Various applications of scatterometry have been described as alternative approaches to separating the effects of focus and exposure while also providing CD metrology data. U.S. Patent Application Publication No. 2004/0190008 to Mieher et al. discloses the use of CD, SWA, and RL values derived from SCD spectra to determine a unique combination of focus and exposure conditions. U.S. Pat. No. 6,429,930 to Littau et al. discloses the use of SCD spectra to uniquely determine focus and exposure by comparison to a library of stored spectra and U.S. Patent Application Publication No. 2004/0223137 to Littau et al. discloses extracting an SCD-derived cross section and comparing it to simulated or measured cross sections as a function of F-E conditions. All SCD approaches are limited to arrayed test structures placed in the scribe lines, not device geometries, and are typically limited to one-dimensional line space patterns or at best regular arrays of two-dimensional features such as contact holes. It should also be kept in mind that while SCD does provide highly repeatable measurements, the CD values extracted from SCD curves are all modeled results based on regression, simulation, or lookup tables and do not represent direct measurements of the actual CD or sidewall angle.

Several approaches have been described using signal analysis of the SEM profiles or images to determine the sidewall profile by comparison to stored reference signals. U.S. Patent Application Publication No. 2002/0051567 to Ganz et al. discloses collecting images of assorted structures and comparing them to a library of the same patterns printed at different focus and exposure settings. This technique does not describe how an adequate set of patterns is determined to insure predictability over a range of F-E conditions, or to separate F-E effects from other imaging errors, nor does it result in CD metrology data of sufficient quantitative precision to insure that the process is operating within specifications. U.S. Pat. No. 6,909,930 to Shishido et al. discloses collecting CD-SEM data and analyzing the shape of the SEM line scan profiles or images to determine whether the CD errors are due to focus or exposure. This approach requires extensive calibration, therefore it can only be applied to specific structures which are carefully characterized beforehand and stored in a library. This technique is also sensitive to slight changes in the SEM line scan profile which may be induced by changes in the SEM conditions rather than the exposure tool conditions. U.S. Pat. No. 6,913,861 to Shishido et al. discloses creating special scribe line test structures such as diamond or other highly tapered patterns where the exposure dose is effectively varied along the structure. SEM line scan analysis is performed on these special structures to deconvolve the effects of focus and exposure. U.S. Pat. No. 6,791,082 to Komuro et al. discloses a similar approach using scribe line patterns of opposite polarity to separate the impact of focus and exposure and to resolve the ambiguity in the sign of any focal plane error. Both of these approaches depend on special scribe line targets, not actual device geometries, and rely on extensive look up tables and the stability of the SEM line scan to extract the condition of the exposure tool.

All of the above approaches aim to separate the contributions of focus and exposure on pattern CDs under the tacit assumption that all other optical parameters can be effectively ignored. U.S. Pat. No. 6,795,163 to Finders et al. shows that these other parameters can be as important, if not more so, in determining the patterned CD errors of a given line width as a function of pitch. Finders et al. disclose that the partial coherence, sigma, of the exposure tool can be adjusted to tilt the CD vs. pitch curve to suffer less CD variation across a range of pitches. This illustrates that even in a system that can adequately separate focus and exposure contributions under ideal conditions, the addition of a small illumination error can drastically impact the measured CD performance and so lead to incorrect determination of the computed focus and exposure adjustments.

It is therefore highly desirable to have a system and technique to effectively monitor or observe the lithography process's F-E condition inside the device with actual circuit design patterns, on any selected wafers and at any selected dice on that wafer. This need can be realized by a system and technique that can extract the F-E conditions of the lithographic process directly from printed patterns on product wafers, on any selected wafers and at any selected dice on that wafer.

It is further desired that this system and technique be able to insure the correct patterning of all structures within the device, not just the structure being measured. This need can be realized by a system and technique that can optimize the selection of the optimum set of measured patterns from actual device design patterns that forms a complete characteristic set such that the correct patterning of this set of patterns serves as measurable proof that all patterns within the device are reproduced within specifications.

Beyond the traditional F-E process window, other optical conditions, e.g., NA, illumination conditions, and aberrations, will also drift over time and impact the patterning of the device structures. It is also highly desirable that these other drifts can be extracted directly from the observations of the printed circuit patterns on wafers.

It is further desirable that this system and technique should be capable of quickly and effectively identifying specific patterns within the device that, when measured, will provide precise and specific feedback to the lithography control system indicating not just the CD values, but also the specific corrections that need to be applied to the system to bring the CDs back within specifications and to maintain the exposure tool and the lithography process at their optimum operating conditions. These needs can be realized by the system and technique to locate a complete characteristic set of patterns within the circuit whose collective response to the multivariate optical and process variations provides a unique monitoring and control solution.

SUMMARY

A method for identifying process window signature patterns in a device area of a mask is disclosed. The signature patterns collectively provide a unique response to changes in a set of process condition parameters to the lithography process. The signature patterns enable monitoring of associated process condition parameters for signs of process drift, analyzing of the process condition parameters to determine which are limiting and affecting the chip yields, analyzing the changes in the process condition parameters to determine the corrections that should be fed back into the lithography process or forwarded to an etch process, identifying specific masks that do not transfer the intended pattern to wafers as intended, and identifying groups of masks that share common characteristics and behave in a similar manner with respect to changes in process condition parameters when transferring the pattern to the wafer.

In one embodiment, a method for identifying process window signature patterns comprises performing simulations of a lithography process, using a representation of a device area of a mask, at two or more non-nominal locations and at nominal condition in a process window to produce simulation results, determining a simulated value for each metric in the pattern-metric pairs from the simulation results, determining simulated values from the simulation results for at least one metric at the two or more non-nominal locations and at nominal condition in the process window, wherein the simulated values for the at least one metric are determined at a plurality of locations with the device area. The method further comprises, for each of the plurality of locations within the device area determining a difference between simulated values for the at least one metric at the two or more non-nominal locations in the process window and the simulated value for the at least one metric at nominal condition, identifying a number of locations within the device area where the difference for the at least one metric is above a threshold, if the number of identified locations is greater than a predetermined number, modifying the threshold and identifying the locations within the device area where the difference for the at least one metric is above the threshold until the number of identified locations within the device area is less than the predetermined number, and assigning patterns associated with the number of identified locations within the device area that is less than the predetermined number to be signature patterns.

In one embodiment, a method for using the signature patterns for lithography process control comprises receiving measured values of the at least one metric associated with the signature patterns, the measured values having been obtained from measurements of the signature patterns on a wafer processed by the lithography process using the mask, finding a location in the process window where a total difference measure between the measured values of the at least one metric associated with all of the signature patterns and the simulated values of the at least one metric associated with all of the signature patterns at the location in the process window is minimized, and determining a change between the location in the process window where the total difference measure is minimized and nominal condition to determine a change in the lithography process. The change in the lithography process is then fed back to the lithography process for process control or fed forward to another process, for example an etching process.

BRIEF DESCRIPTION OF THE DRAWINGS

FIG. 7 is a chart showing sensitivities of pattern-metric pairs to various process condition parameters, according to one embodiment of the invention;

FIG. 8 is a chart showing sensitivities of pattern-metric pairs to various process condition parameters, according to another embodiment of the invention;

DETAILED DESCRIPTION OF THE INVENTION

Figure 1:
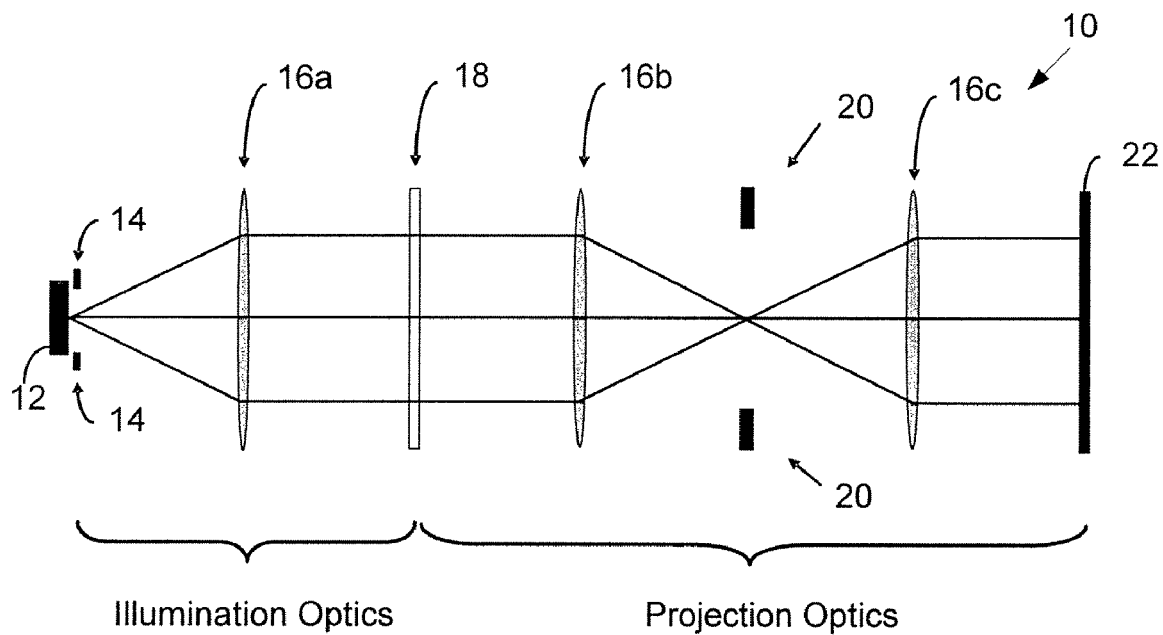
FIG. 1 is a block diagram of one embodiment for an exposure tool.
Figure 2:
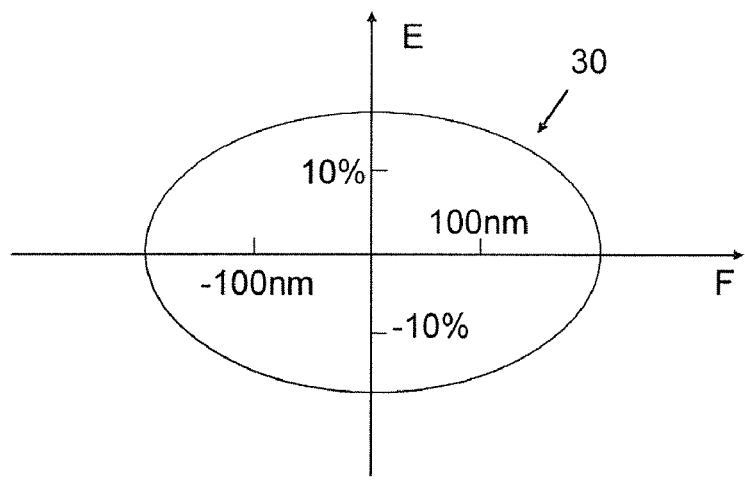
FIG. 2 is a diagram of one embodiment of a process window defined in a focus-exposure space.
Figure 3:
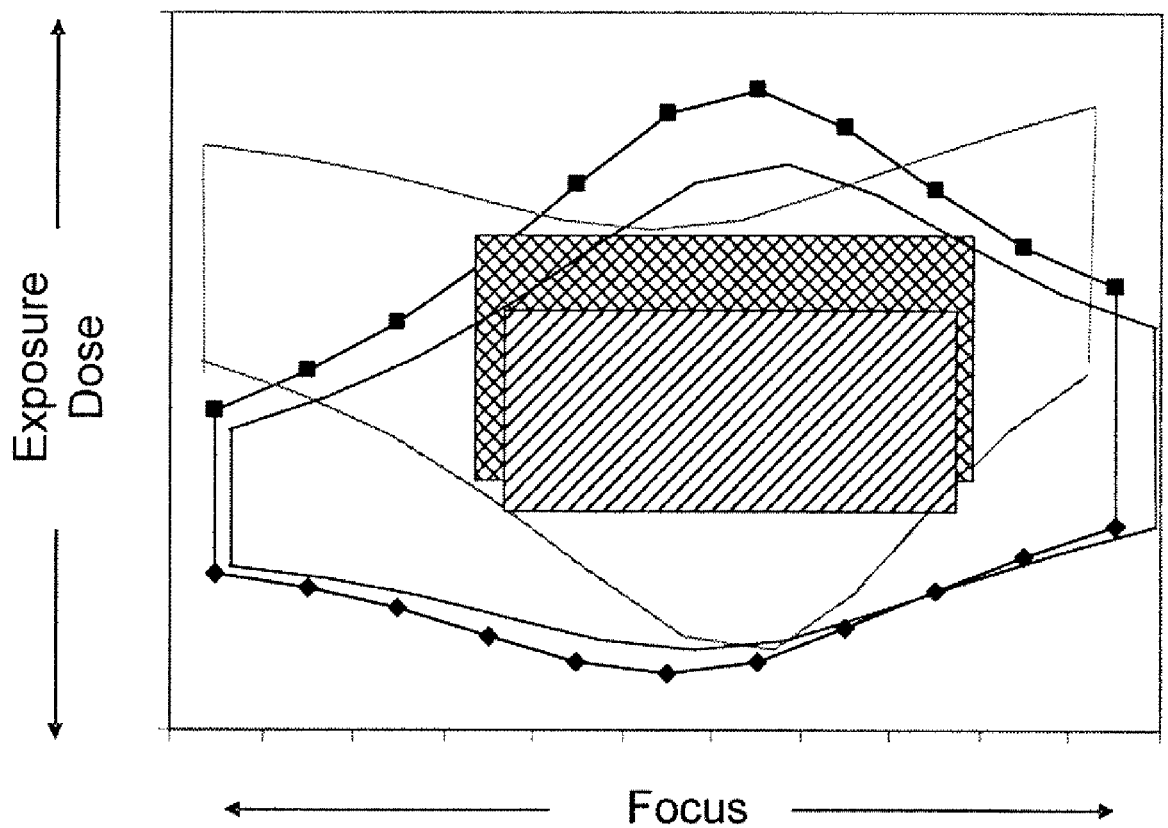
FIG. 3 is a diagram of multiple overlapping process windows in a focus-exposure space.

The method of the invention enables direct process window extraction from device patterns on production wafers by determining a set of process window signature patterns (also referred to herein as "signature patterns") within a device design that, when monitored as part of a lithography process control system, provide clear feedback to the control system on how the lithography process is performing, whether the CDs for all features within the device, not just the measured features, are within specification, and which process condition parameters should be adjusted and by how much in order to maintain the lithography process and exposure tool at the optimum operating condition.

It is well known that device patterns, depending on their environment, respond differently to changes in focus, exposure dose, and other process condition parameters. The collective response of the signature patterns to the entire range of process condition parameters can be decomposed and analyzed to determine the exact process condition parameters that have drifted and by exactly how much. The signature patterns can be selected for any given device layout. The signature patterns are the minimum subset of patterns in the design area of a mask that allow for the required level of process control with the minimum amount of metrology effort and expense. The metrology data from the signature patterns is used to extract the conditions of all process condition parameters that caused drift in the imaging process. The method of the invention includes simulating the impact of these process drifts on every signature pattern within the circuit across the full field of the exposure tool and determining what corrections should be applied to the lithography process to optimize the pattern transfer for the specific devices being patterned, as well as what corrections to process condition into the fab-wide process control system to be applied at later steps in the process and/or to other products which would be subsequently patterned using the same process equipment.

As used herein, the term "process condition parameters" refers to any of the exposure tool parameters and/or the lithographic process parameters that can be modeled and whose impact on the pattern transfer process can be simulated, whether or not that parameter can be adjusted and corrected.

The process condition parameters may also be called "input parameters" to the lithography process. The process condition parameters can be subdivided into adjustable and non-adjustable parameters, and the adjustable parameters may be further sub-divided into those that are adjustable by the end user and those that require more extensive service procedures to adjust. The user response to changes in the process condition parameters may differ depending on whether or not the particular parameter is user-adjustable. These distinctions will impact the user response to observed changes in the process condition parameters, but it does not restrict which process condition parameters may be monitored.

While no useful set of patterns can be found within a device design such that each pattern would be sensitive to the variation of one and only one process condition parameter, there does exist a set of signature patterns such that the combined response of the signature patterns uniquely identifies the combination of all process condition parameter variations that contributed to the printing of the circuit design. That is, while no specific individual pattern can be used in isolation to detect variations in focus and only variations in focus while another pattern monitors exposure, another monitors spherical aberration, another monitors partial coherence of the illumination system, and so on, there does exist a set of signature patterns whose response can be uniquely decomposed to identify any deviations from nominal in any of the above-mentioned process condition parameters and to determine the specific corrections to apply to each of the process condition parameters. Even though no single signature pattern acts as a unique probe of one and only one process condition parameter, the set of signature patterns acts collectively as if it were a complete set of probes, each of which responds to one and only one of the process condition parameters of interest.

The full chip simulation system disclosed in U.S. Pat. No. 7,003,758, the subject matter of which is hereby incorporated by reference in its entirety, can be used to automatically simulate the response of a full chip design to each of the process condition parameters of interest. The simulation system may also be used to determine the optimum set of signature patterns that have the highest sensitivity to the process condition parameters of interest with the minimum number of measurements required, create a metrology recipe to collect the required images and/or CD data from printed wafers, extract metrics of interest (image contours, CD values, or other metrics of pattern quality) from the measured data, and analyze these metrics to uniquely identify all variations in the process condition parameters. The extracted process condition parameters can be fed back into the simulation system to predict the quality of the printed patterns across the chip and across the full wafer, determine if the quality is acceptable or not, and pass back a go/no go decision flag and correction parameters to the manufacturing control system.

In a simple example for positive photoresist, as the exposure dose is reduced, the CD of all line patterns (chrome patterns on the mask) will increase and the CD of all space patterns will decrease. However, when focus changes, some spaces and line patterns will grow and others will shrink, depending on the exact pattern environment, such as the pitch and OPC correction patterns in the vicinity, and the exact exposure dose. In this example, a full chip simulation is performed to find those isolated lines, and line-space pairs with the right pitch, that behave differently due to focus and exposure changes. Using the measured relative change in linewidth for these patterns, the location in the focus-exposure process window can be identified. This example is provided only as the simplest representation of the more general case.

Figure 4:
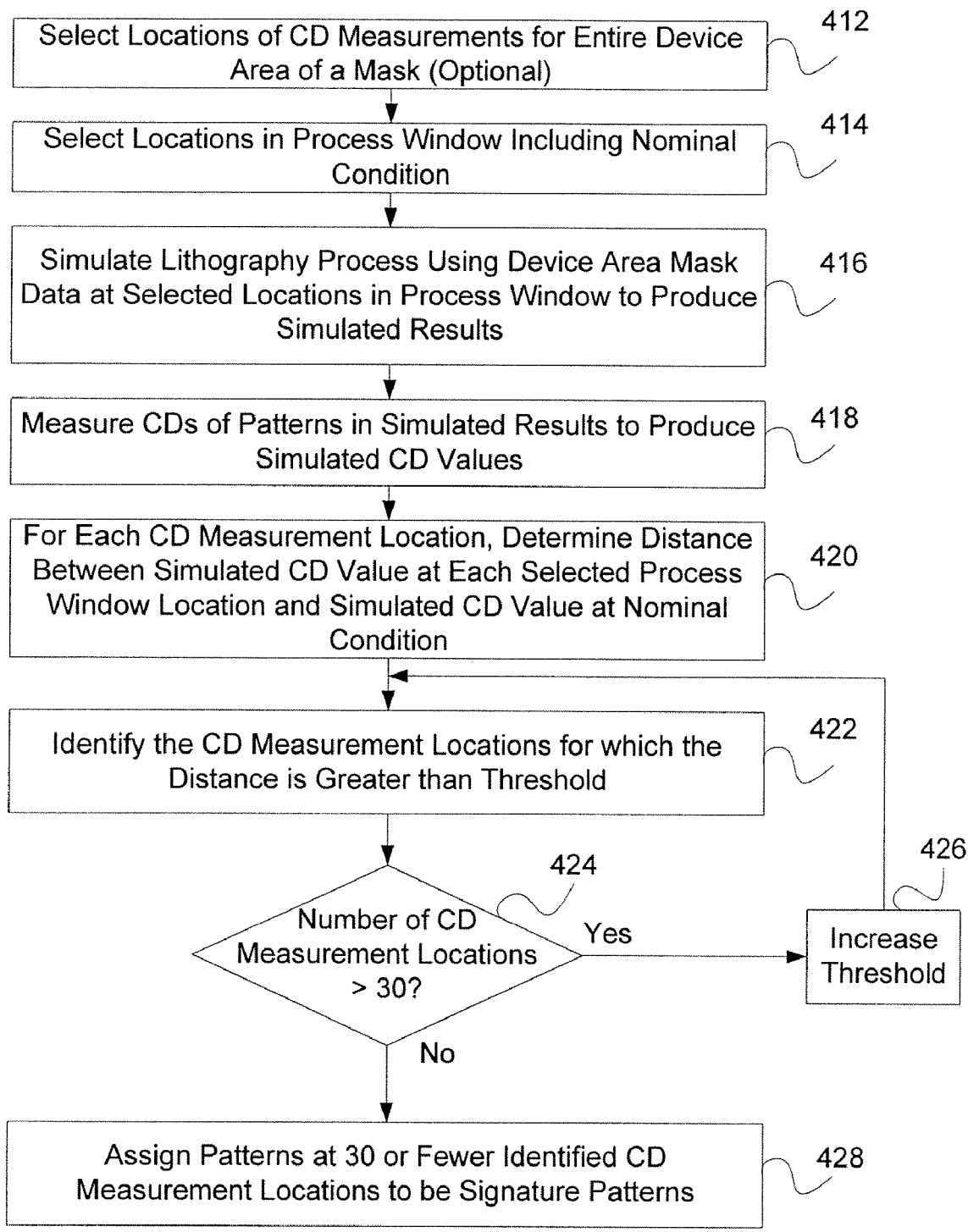
FIG. 4 is a flowchart of method steps for identifying process window signature patterns of a mask, according to one embodiment of the invention.

FIG. 4 is a flowchart of method steps for identifying process window signature patterns in a circuit design, according to one embodiment of the invention. In the disclosed example, the method of FIG. 4 will identify 20-30 signature patterns, which is typically a sufficient number of signature patterns to accurately monitor a lithography process. However, a larger number of signature patterns may be identified for use with a fast measurement metrology system. In optional step 412, locations throughout the entire device area of a mask where CD measurements are to be taken are selected. The device area of a mask includes the patterns that will be printed on a portion of a wafer that will ultimately become the finished integrated circuit device. The device area of the mask does not include any test patterns that will be printed in the scribe lines of a wafer. For ease of illustration, only a CD measurement metric is discussed in conjunction with FIG. 4. However, any other suitable metric or combination of metrics is within the scope of the invention. For example, the metrics can be one-dimensional metrics such as CD measurements, two-dimensional metrics such as corner rounding, line-end pullback, narrowing, widening, and corner-to-corner separation, three-dimensional metrics such as resist thinning, sidewall angle, top profile rounding, footing at the resist-substrate interface, sidewall curvature, and asymmetry between sidewalls, or any combination of these. All of these metrics can be measured on printed wafers by existing metrology tools, such as CD-SEMs, tilt SEMs, scatterometers, optical CD metrology tools, and atomic force microscopes (AFM). There are numerous references in the literature to feature extraction, such as Allgair et al, "Characterization of OPC Features," SPIE Proc., Vol. 4344, pp. 200-207 (2001), Wiaux et al., "Assessment of OPC Effectiveness Using Two-dimensional Metrics," SPIE Proc., Vol. 4691, pp. 395-406 (2002), and references therein.

In step 414, locations in a process window are selected including nominal condition. The locations in the process window are defined by values of process condition parameters to the lithography process. The process condition parameters may include focus, exposure dose, film stacks, lens aberrations, illumination shifts, coherence, and/or any other process condition parameters to the lithography process, whether user-correctable or not. In the following discussion, the process window is in a two-dimensional focus-exposure space for ease of illustration. The locations in the process window are selected so as to include multiple values of each process condition parameter, i.e., varying values of focus and exposure dose, and the nominal condition of each process condition parameter. In a preferred embodiment, the selected locations in the process window include two or more non-nominal conditions and nominal condition. The distance between the varying values of the process condition parameters is preferably the minimum adjustable step size of the process condition parameter.

In step 416, the lithography process is simulated using data representative of the device area of a mask at each of the selected locations in the process window, producing simulation results for each value of the process condition parameters. The lithography process is simulated using a lithography simulation system, one embodiment of which is described below in conjunction with FIG. 13. The simulated results may be simple aerial images with a fixed or variable threshold imposed to simulate the edges of a resist pattern, may include more complex resist models, including first-principles models of the resist response to exposure and post-exposure baking, acid and base diffusion effects, and other kinetic effects associated with chemically amplified resist systems, or may include the aerial image simulation followed by a simplified resist model, such as a lumped parameter model or other simplified physical representation of the full resist process. Such simplified models are well known (see Brunner, "Impact of Resist Blur on MEF, OPC and CD Control," SPIE Proc., Vol. 5377, pp. 141-149 (2004)) and are often preferred since they are much more computationally efficient to implement than first-principles models, and have been demonstrated to produce simulated resist patterns with extremely good correlation to actual measured resist patterns.

In step 418, the CDs of the patterns in the simulation results are measured to produce simulated CD values. The CDs are measured at the locations selected in optional step 412 or at other regularly-spaced locations within the device area. Then, in step 420, for each CD measurement location, the distance between the simulated CD values at the selected locations in the process window and the simulated CD value at nominal condition is determined. In one embodiment, the minimum distance can be determined in a root-mean-square sense. For example, $$D_{nom}(j) = \sqrt{\frac{1}{N} \sum_{i=1}^{N} W_i [CD(E_i, F_i) - CD(E_0, F_0)]^2}$$

where j=(1, 2, ..., M), M is the total number of the selected locations throughout the entire device area of a mask where CD measurements are to be taken, $D_{nom}(j)$ is the difference between the simulated CD values at the selected locations in the process window and the simulated CD value at nominal condition for the j-th CD measurement location, N is the number of selected locations in the process window, $W_i$ is a weighting factor, $CD(E_i, F_i)$ is the simulated CD value at location $(E_i, F_i)$ in the process window, and $CD(E_0, F_0)$ is the simulated CD value at nominal condition. In step 422, the CD measurement locations for which the distance $D_{nom}(j)$ is greater than a threshold are identified. The value of the threshold is preferably based on the noise of the lithography simulation system used to produce the simulated results.

If, in step 424, it is determined that the number of CD measurement locations for which the distance $D_{nom}(j)$ is greater than the threshold is greater than 30, then in step 426 the threshold is increased and the method returns to step 422. If, in step 424, it is determined that the number of CD measurement locations for which the distance $D_{nom}$ is greater than the threshold is less than 30, then the method continues in step 428. In step 428, the patterns associated with the 30 or fewer CD measurement locations are assigned to be the process window signature patterns. In another embodiment, if the number of CD measurement locations for which $D_{nom}(j)$ is greater than the threshold is much fewer than 30, then the threshold will be decreased until a sufficient number of locations are identified.

Figure 5:
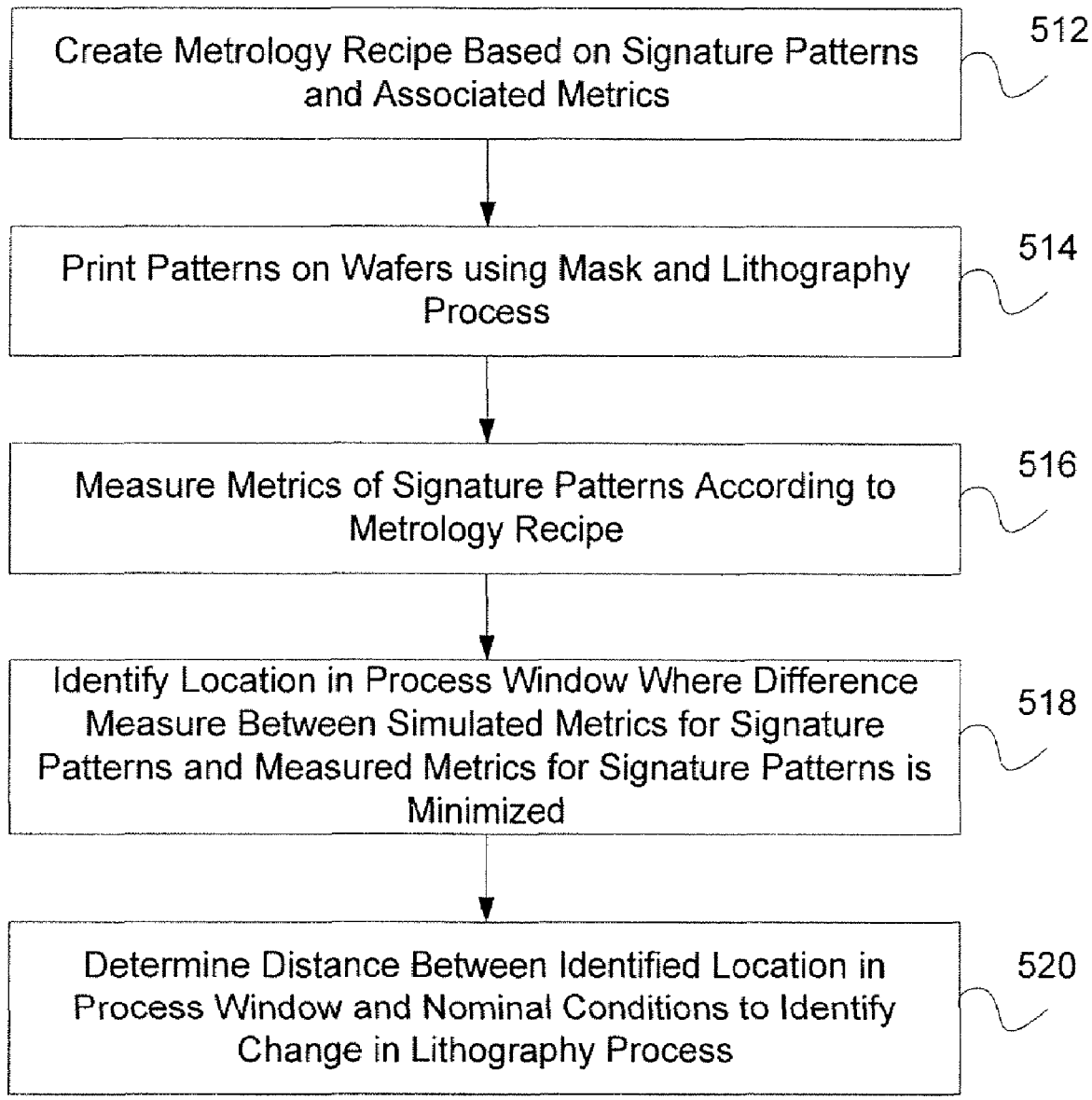
FIG. 5 is a flowchart of method steps for using the identified process window signature patterns for process control of a lithography process, according to one embodiment of the invention.

FIG. 5 is a flowchart of method steps for identifying changes in a lithography process, according to one embodiment of the invention. In step 512, a metrology recipe for measuring patterns on processed wafers is created based on the signature patterns and their associated metrics. For example, if focus error and its variations across the exposure field is a process condition parameter to be evaluated, it is useful to measure the signature patterns near the four corners of the exposure field of the exposure tool. If stray light is a process condition parameter to be evaluated, signature patterns can be measured in regions of the device area where stray light is expected, typically where the chrome pattern is sparse. The metrology recipe can be created either manually or automatically. Automatic metrology recipe creation may include insertion of wafer alignment, pattern recognition targets, and simulations of what the targets will look like in the metrology tool to facilitate automatic alignment and pattern capture. To save measurement time and effort, the pattern recognition targets may be defined as the signature patterns themselves, or easily identifiable structures close enough to the signature patterns to allow rapid measurement after the pattern recognition is complete with little or no stage movement required between pattern recognition and metrology data collection. In addition to the locations of the signature patterns, the metrology recipe may include the metric of interest to be measured for each pattern. The metrology recipe, including all necessary alignment and pattern recognition images, target locations, and metrology metrics of interest, may be stored in a format that can be read by the metrology tool with no operator intervention required.

Next, in step 514, wafers are processed using the lithography process and the mask to produce printed patterns on the wafer. In step 516, the metrics of the printed signature patterns on the wafer are measured according to the metrology recipe. In step 518, the location in the process window where a total difference measure between the simulated value for each metric and the measured value for each metric is minimized for all signature patterns is identified. In one embodiment, the total difference measure between the simulated and measured value for each metric is calculated as follows:

$$G(F, E) = \sqrt{\frac{1}{N}\sum_{i=1}^{N} W_i [M_{wafer}^{(i)} - M_{sim}^{(i)}(F, E)]^2}$$

where G (F,E) is the difference measure as a function of the location in the process window (here values of focus, F, and exposure dose, E), N is the number of the signature patterns, where there is one metric measured for each signature pattern, $W_i$ is a weighting factor, $M_{wafer}^{(i)}$ is a measured value of metric M of the i-th signature pattern, and $M_{sim}^{(i)}(F, E)$ is a simulated value of metric M of the i-th signature pattern at a location (F,E) in the process window. The location in the process window, i.e., the values of focus and exposure dose (F,E), that results in the minimum value for G(F,E) is identified. In one example, determining the minimum value of G(F,E) may be performed by selecting an arbitrary location in the process window, solving for G(F,E) for that location, and iterating these steps until the minimum value of G(F,E) is determined. Any appropriate techniques for determining the minimum value of G(F,E) are within the scope of the invention, for example using a steepest decent algorithm or using a look-up table.

In step 520, the distance between the identified location in the process window and nominal condition of the lithography process is determined. This distance identifies a change in the process condition parameters (in this example, focus and exposure dose) of the lithography process. This change in the process condition parameters can then be fed back to a control system for the lithography process or fed forward to a control system for other processes, for example an etch process.

Figure 6:
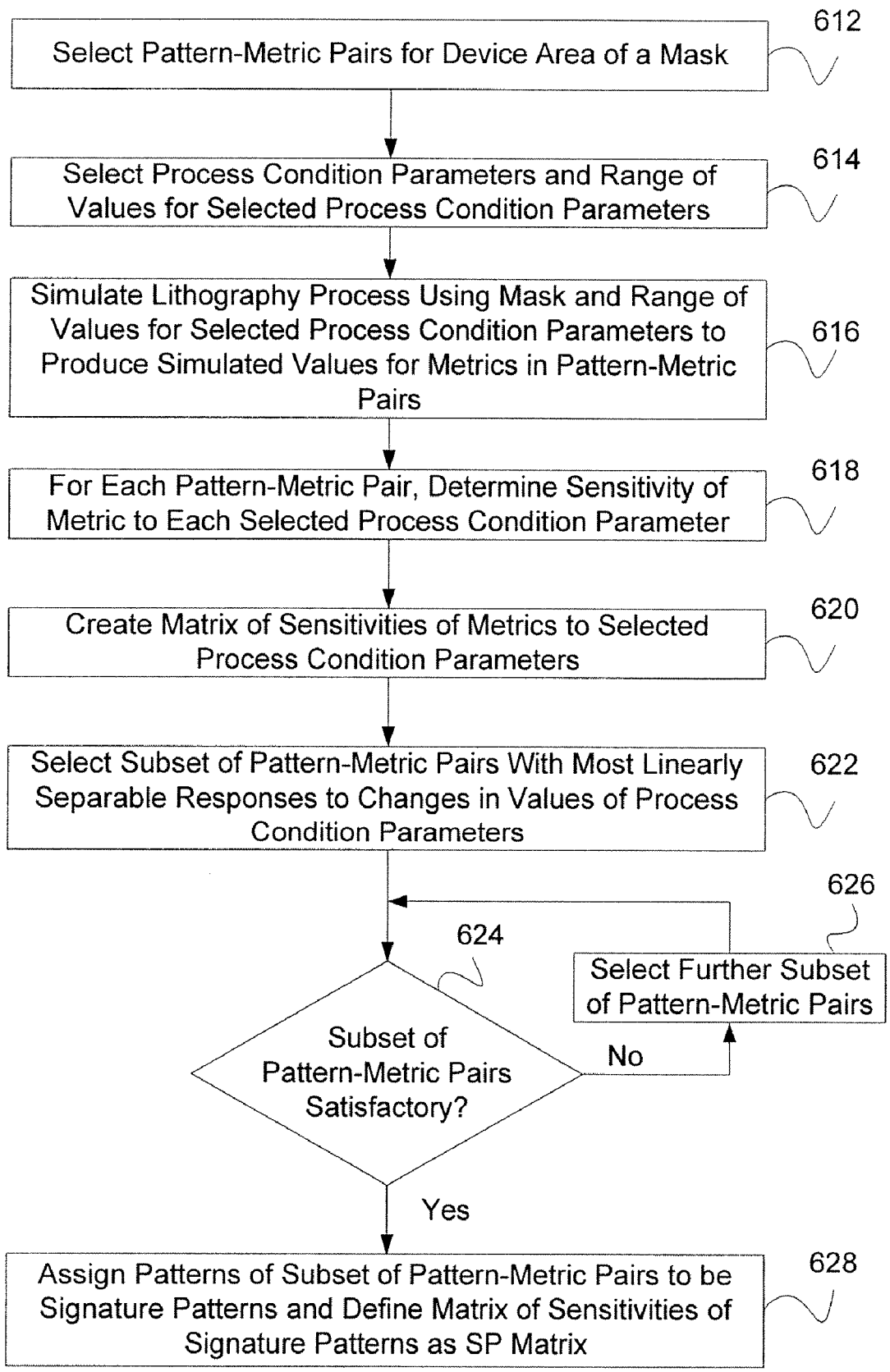
FIG. 6 is a flowchart of method steps for identifying process window signature patterns of a lithography process, according to another embodiment of the invention.

FIG. 6 is a flowchart of method steps for identifying process window signature patterns in a device area of a mask, according to another embodiment of the invention. In step 612, pattern-metric pairs are selected for the mask being evaluated. For each pattern or some selected subset of patterns in the device area of the mask, one or more metrics are selected to form pattern-metric pairs. That is, each selected pattern may be uniquely paired with a metric or each selected pattern may be paired with more than one metric. The metrics may be any one-dimensional metric, two-dimensional metric, or three-dimensional metric capable of being measured on printed wafers by existing metrology tools. In step 614, process condition parameters of the lithography process are selected and a range of values for each of the selected process condition parameters is selected. The process condition parameters may include focus, exposure dose, film stacks, lens aberrations, coherence, illumination shifts, and/or any other process condition parameters to the lithography process, whether user-correctable or not. In step 616, the lithography process is simulated using data representative of the device area of the mask over the range of values of the selected process condition parameters to produce simulated results. For greatest accuracy, a set of simulations is performed for each of the process condition parameters, where each set of simulations is performed with varied values of the current process condition parameter while all other process condition parameters are kept fixed. Fewer numbers of simulations may be adequate for the purpose of identifying signature patterns.

In step 618, for each pattern-metric pair, differences between the metrics of the simulation results are determined and the sensitivity of each metric to each of the process condition parameters is determined. The sensitivity can be expressed as an average rate of change in a metric across the full range of values for the process condition parameters, as a derivative (instantaneous rate of change at specific values of the process condition parameters), as a total range of deviation, or some similar, normalized indication of relative sensitivity with respect to a specific process condition parameter of interest.

Next, in step 620, a matrix of the sensitivities of the metrics to the process condition parameters is created. In one embodiment, the matrix has one column for each process condition parameter and one row for each pattern-metric pair. This matrix is referred to herein as the pattern matrix.

FIG. 7 shows an ideal case of a pattern matrix, in which certain rows in the matrix have zeros in every column except one, and each column intersects at least one such row. This matrix represents the ideal situation where, for each process condition parameter of interest, there exists a specific pattern-metric pair that responds to that particular process condition parameter, and only to that particular process condition parameter, and for each process condition parameter there exists at least one pattern-metric pair that responds exclusively to that process condition parameter. Each of the patterns in these pattern-metric pairs would be a perfect signature pattern, and the set of perfect signature patterns would allow for perfect monitoring of the lithography process such that if any process condition parameter is varied from its nominal position, the changes observed in the metrics associated with the signature patterns would enable a control system to unambiguously identify which process condition parameter had varied and by exactly how much. As noted above, this idealized case is not possible given the complex responses of most patterns to changes in process condition parameters. Since this idealized pattern matrix resembles a matrix of eigenvalues, the patterns of the pattern-metric pairs may also be called "eigen patterns."

In a slightly more realistic but still idealized example, FIG. 8 shows a pattern matrix where some of the pattern-metric pairs respond to more than one process condition parameter, and one process condition parameter affects more than one pattern-metric pair. While a unique one-to-one correspondence between a pattern-metric pair and an process condition parameter does not exist, the matrix of FIG. 8 is still highly desirable for process control since the sensitivities are negatively correlated, i.e., the sensitivity of one pattern-metric pair to two process condition parameters and the response of multiple pattern-metric pairs to a single process condition parameter are in opposite directions, enabling the root cause of any process drift to be easily diagnosed from the measured sensitivity data. The simultaneous existence of both positive and negative correlation, by two different pattern-metric pairs, enables the identification of a unique solution to the set of process condition parameters. In a more general sense, the number of linearly independent or nearly independent pattern-metric pairs needs to be equal to or greater than the number of process condition parameters. Stated another way, the pattern matrix should be as non-singular as possible, i.e., a minimum set of pattern-metric pairs is needed such that the rank of the pattern matrix is the same as the number of process condition parameters so that changes to all of the process condition parameters can be solved for robustly.

In step 622, a subset of the pattern-metric pairs that have the most linearly separable sensitivities to changes in the values of the process condition parameters is selected. In one embodiment, the pattern matrix is analyzed to find the pattern-metric pairs where a limited number of process condition parameters have the most dominant effect on the metric relative to all of the other process condition parameters. These pattern-metric pairs form an initial subset of pattern-metric pairs. A requirement for the initial subset of pattern-metric pairs is that for each process condition parameter, at least one pattern-metric pair with high sensitivity to that process condition parameter is included. In another embodiment, the pattern matrix is analyzed to determine the minimum number of pattern-metric pairs required to satisfactorily monitor the lithography process. This determination can be based on sample testing of a submatrix of the sensitivities to determine a set of pattern-metric pairs with the most easily deconvolved sensitivities, i.e., where the sensitivities of the pattern-metric pairs to a range of different process condition parameter variations can be used to most accurately solve for the correct values of variations of the process condition parameters. This sample testing can be performed using the lithography simulation system described below in conjunction with FIG. 13.

In another embodiment, the full pattern matrix is analyzed using other means, such as algebraic testing. In this case, the matrix can be analyzed and the initial subset of pattern-metric pairs that have the most nearly orthogonal set of sensitivities, that is, the set where the sensitivities to the full set of process condition parameters are as different as possible, are identified. Various statistical metrics can be employed to identify the optimum subset of pattern-metric pairs and select the minimum number of pattern-metric pairs needed for reliable process monitoring and control, including, but not limited to, metrics of the respective cross-correlation between the various pattern-metric pairs and process condition parameters and metrics of the orthogonality of the sensitivities of the pattern-metric pairs.

In step 624, the initial subset of pattern-metric pairs is evaluated. The initial subset of pattern-metric pairs may be evaluated based on how dominant one or more process condition parameters is compared to the other process condition parameters, on the sensitivity of the pattern-metric pair to changes in the process condition parameters, and on other factors, such as ease of measurement of the specific metric using the metrology tools available. A satisfactory subset of pattern-metric pairs must have at least a number of pattern-metric pairs equal to the number of process condition parameters and must respond strongly to multiple different process condition parameters, but with linearly independent sensitivities.

If the initial set of pattern-metric pairs is not satisfactory for reliable monitoring of the lithography process, then in step 626 a further subset of pattern-metric pairs is selected. Any of the techniques described above for selecting the initial subset of pattern-metric pairs may also be used to select the further subset of pattern-metric pairs. Then the method returns to step 624 where the further subset of pattern-metric pairs is evaluated. Steps 626 and 624 are repeated until a satisfactory subset of pattern-metric pairs is selected. In step 628, the patterns of the final subset of pattern-metric pairs are assigned to be the signature patterns, and a matrix of the sensitivities of the signature patterns and their associated metrics to the process condition parameters is defined as the signature pattern matrix (SP matrix).

In another embodiment, the pattern matrix has more than one column per process condition parameter. For example, if derivatives of the sensitivities are computed, the pattern matrix may include one column for each process condition parameter at each specific value of the process condition parameter to distinguish which pattern-metric pairs are most sensitive to that process condition parameter across the range of values assumed for that process condition parameter. The final subset of pattern-metric pairs are then constructed to insure that changes in the metrics of the final set of pattern-metric pairs can be well resolved to determine the specific process condition parameter changes. This is especially useful if one of the patterns has a good response to a process condition parameter as its value changes in one direction, but not in the other. In this case, it would be valuable to include complementary patterns, one of which responds clearly to changes of either sign in the process condition parameter, thereby insuring complete process coverage over the full range of process condition parameters. Focus is a typical example of an process condition parameter where numerous patterns show a clearly one-sided response.

Figure 9:
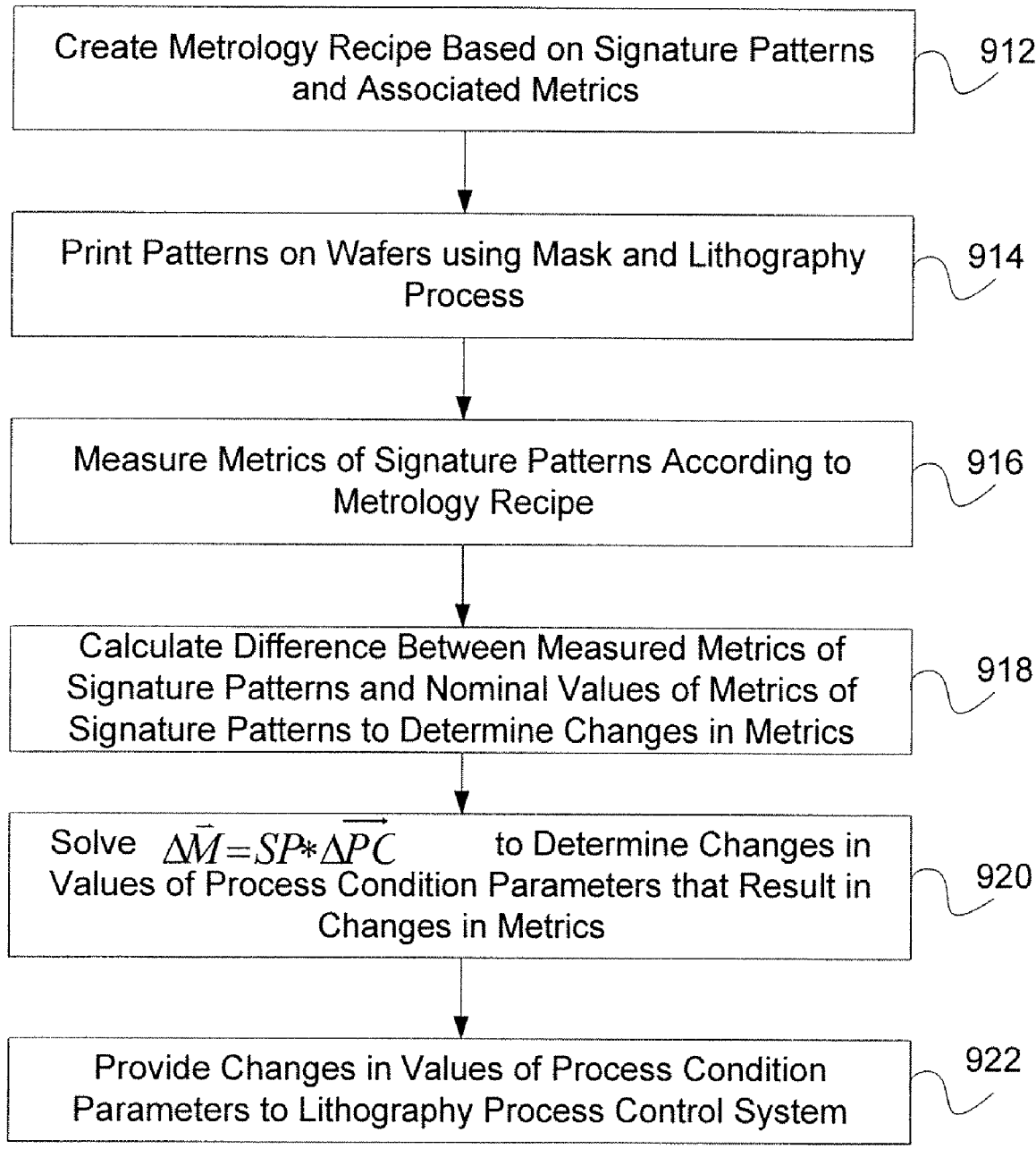
FIG. 9 is a flowchart of method steps for identifying changes in the values of process condition parameters based on changes in the metrics of process window signature patterns, according to one embodiment of the invention.

FIG. 9 is a flowchart of method steps for identifying changes in the values of process condition parameters based on measured changes in the metrics of signature patterns, according to one embodiment of the invention. In step 912, a metrology recipe for measuring patterns on processed wafers is created based on the signature patterns and their associated metrics. For example, if focus error and its variation across the exposure field is a process condition parameter to be evaluated, it is useful to measure the signature patterns near the four corners of the exposure field of the exposure tool. If stray light is a process condition parameter to be evaluated, signature patterns can be measured in regions of the mask where stray light is expected, typically where the chrome pattern is sparse. The metrology recipe can be created either manually or automatically. Automatic metrology recipe creation may include insertion of wafer alignment, pattern recognition targets, and simulations of what the targets will look like in the metrology tool to facilitate automatic alignment and pattern capture. To save measurement time and effort, the pattern recognition targets may be defined as the signature patterns themselves, or easily identifiable structures close enough to the signature patterns to allow rapid measurement after the pattern recognition is complete with little or no stage movement required between pattern recognition and metrology data collection. In addition to the locations of the signature patterns, the metrology recipe may include the metric of interest to be measured for each pattern. The metrology recipe, including all necessary alignment and pattern recognition images, target locations, and metrology metrics of interest, may be stored in a format that can be read by the metrology tool with no operator intervention required.

In step 914, wafers are processed using the lithography process and the mask to produce printed patterns on the wafer. In step 916, the metrics of the printed signature patterns on the wafer are measured according to the metrology recipe. In step 918, differences between the measured values of the metrics associated with the signature patterns and nominal values of the metrics are calculated to determine changes in the metrics. Optionally, previously-measured values of the metrics from previously-printed wafers may be used instead of the nominal values. The measured values of the metrics associated with the signature patterns may also be used to determine the critical dimension distribution across the exposure field of the exposure tool or across the entire wafer.

Then, in step 920, the equation $\Delta\vec{M}=SP*\Delta\vec{PC}$ is solved to determine changes in the values of the process condition parameters that resulted in changes to the metrics, where $\Delta\vec{M}$ is a vector that includes the changes in the values of the metrics associated with the signature patterns, SP is the SP matrix, and $\Delta\vec{PC}$ is a vector that includes the changes in the values of the process condition parameters. Since the SP matrix is known, any changes in the values of the process condition parameters can be determined for any measured changes in the metrics associated with the signature patterns. There are many numerical methods in the literature to solve a matrix inversion problem, and any such numerical method is within the scope of the invention. In step 922, the changes in the values of the process condition parameters are provided to a lithography process control system. The FIG. 9 embodiment assumes a perfect linear system and only a single step matrix inversion operation solves for the changes in the values of the process condition parameters. For some SP matrices, where the values of the sensitivities in the SP matrix are not constant for all values of the process condition parameters, a single step solution for the changes in the values of the process condition parameters may not be sufficiently accurate.

Figure 10:
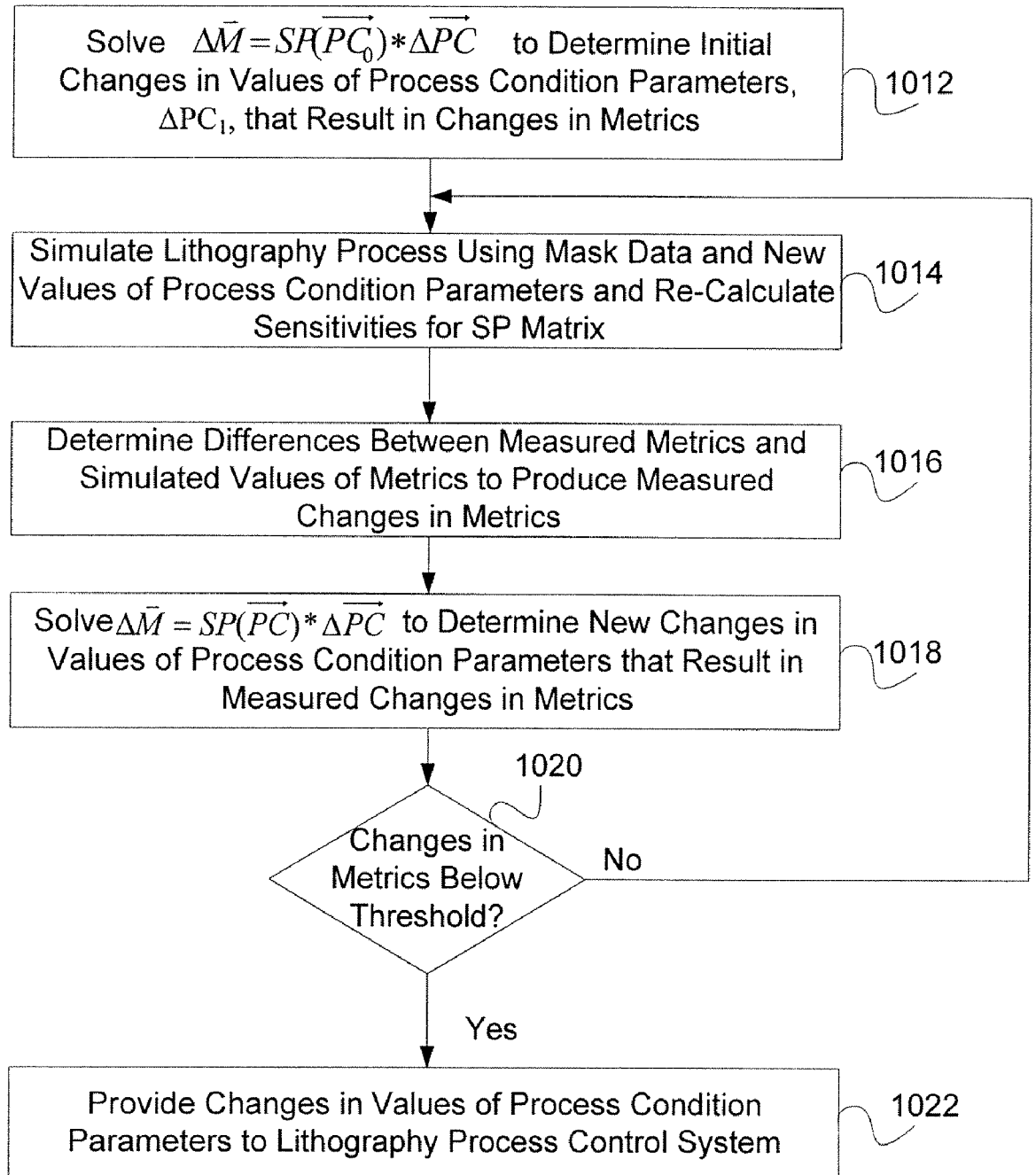
FIG. 10 is a flowchart of method steps for iteratively refining a signature pattern matrix and solving for changes in the values of process condition parameters, according to one embodiment of the invention.

FIG. 10 is flowchart of method steps for iteratively refining a signature pattern matrix and solving for changes in the values of process condition parameters, according to one embodiment of the invention. FIG. 10 is another embodiment of steps 920 and 922 in FIG. 9, where the values of the sensitivities in the SP matrix are not constant for all values of the process condition parameters. In may cases, the sensitivities that relate the process condition parameters to the measured changes in the metrics depend upon the process condition parameter settings, illustrated mathematically as $\Delta\vec{M}=SP(\vec{PC})*\Delta\vec{PC}$, where $\Delta\vec{M}$ is a vector that includes the changes in the values of the metrics associated with the signature patterns, $SP(\vec{PC})$ is the SP matrix as a function of process condition parameters $\vec{PC}$, and $\Delta\vec{PC}$ is a vector that includes the changes in the values of the process condition parameters. In step 1012, the equation $\Delta\vec{M}=SP(\vec{PC}_0)*\Delta\vec{PC}$, where $\vec{PC}_0$ are the nominal values for the process condition parameters, is solved to determine initial changes in the values of the process condition parameters, $\Delta\vec{PC}_1$, that resulted in changes to the metrics. In step 1014, the lithography process is simulated using the data representative of the device area of the mask and the changed values of the process condition parameters determined in step 1012 to produce new simulated values of the metrics associated with the signature patterns, and the sensitivities in the SP matrix are recalculated. This matrix inversion can be solved in an iterative fashion using any of the well-known numerical methods. Damping factors may be applied to the computed changes in the process condition parameters to prevent oscillation about the solution point or other non-convergence issues. For example, if initial nominal process condition parameter values are designated as $\vec{PC}_0$ and the first iteration of solving for the changes in the process condition parameters produces values of $\Delta\vec{PC}_1$ and new values of the process condition parameters $\vec{PC}_1$ such that $\Delta\vec{PC}_1=\vec{PC}_1-\vec{PC}_0$, a damped set of values may be calculated using $\vec{PC}_{1d}=\vec{PC}_0+d*\Delta\vec{PC}_1$ where d<1. The damped values for the process condition parameters are then used to determine new SP matrix coefficients $SP(\vec{PC}_{1d})$. In step 1016, differences between the measured values of the metrics associated with the signature patterns and the simulated values of the metrics are calculated to produces measured changes in the metrics. In step 1018, new changes in the values of the process condition parameters, $\Delta\vec{PC}_2$, are determined using the changes in the metrics and the recalculated SP matrix. $\Delta\vec{PC}_2$ may be damped again and then added to an accumulated $\Delta\vec{PC}$ to form a total $\Delta\vec{PC}$. In step 1020, the changes in the metrics are compared to a threshold, and if the changes are not below the threshold, the method returns to step 1014 and the changes in the process condition parameters are iteratively solved for until final $\vec{PC}$ values converge such that the measured changes in the metrics are below the threshold. If, in step 1020, the changes in the metrics determined in step 1016 are below the threshold, then in step 1022 the changes in the values of the process condition parameters are provided to the lithography process control system.

A distribution of the changes in the process condition parameters across a wafer can be correlated with wafer chip yield maps. Statistical analysis (e.g., ANOVA, i.e., ANalysis Of VAriations) can be used to extract information on, for example, which process condition parameter is the critical yield limiting factor or which drift or variation in certain process condition parameters are most highly correlated with certain signatures of yield fluctuation or excursions. These could become critical information in fab yield management and yield improvements.

The calculated changes in the values of the process condition parameter can also be used to adaptively adjust the metrology recipe. As changes in the process condition parameters are detected, additional measurements of the metrics associated with the signature patterns can be incorporated into the metrology recipe, either to measure the metrics at more locations across the field and/or across the wafer, or to measure additional signature patterns for added sensitivity to the process condition parameters that are beginning to show unacceptable drift. As additional data and/or corrective action are taken to improve the process control of the lithography process, the metrology recipe may be adaptively relaxed back to the minimum possible metrology burden.

Figure 11:
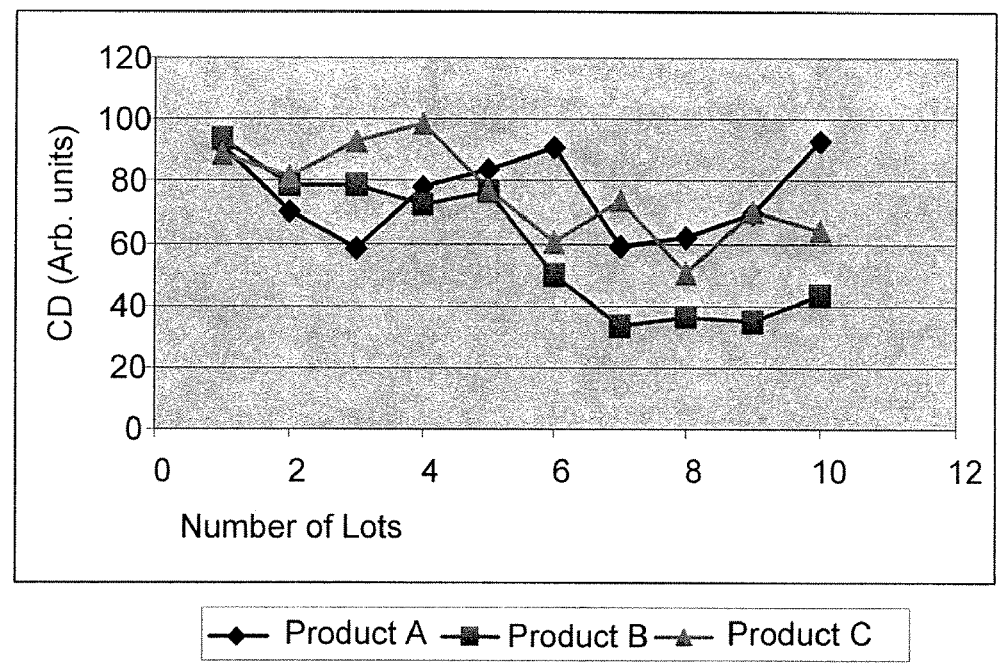
FIG. 11 is a chart showing critical dimensions of three products vs. number of lots processed.

The calculated changes in the values of the process condition parameters can also be used to enable model-based advanced process control (MBAPC) of the lithography process. In conventional control schemes for a wafer fab running multiple different products and processes, critical dimension drift is usually monitored and corrected on a product-by-product and layer-by-layer basis. FIG. 11 illustrates an example of CD measurements for three products plotted vs. number of lots processed. The CDs for Product B in particular show a sudden change after lot 5. An exposure dose change for later lots of this product would improve the CD measurements. However, it is unclear if a similar correction, or indeed, any correction at all, should be applied to the other two products. The situation becomes more complicated if the effects of different exposure tools on the CD trends are included. In this case, even if the CD measurements for Product B exposed on exposure tool No. 1 begin to drift unacceptably so that an exposure dose correction is warranted for future runs on the same exposure tool, the corrections that will be required for the same product on different exposure tools is unknown. Finally, if multiple layers of multiple products on multiple exposure tools are tracked, even if the correction to apply for a given layer of a given product on one exposure tool is known, the proper correction for other layers of other products, or of the same layer of the same product on a different exposure tool, is unknown.

In the simplest scheme one can simply assume that all CD measurement drifts are due to exposure dose variation and change the exposure dose for all other layer/product combinations on exposure tool No. 1. Such schemes have been implemented, but if the true source of the CD measurement drift was not an exposure dose change, but rather focus, aberration, or other process condition parameter, the net result may be incorrect compensation and a degradation, rather than an improvement, in the CD performance of all product/layer combinations.

Figure 12:
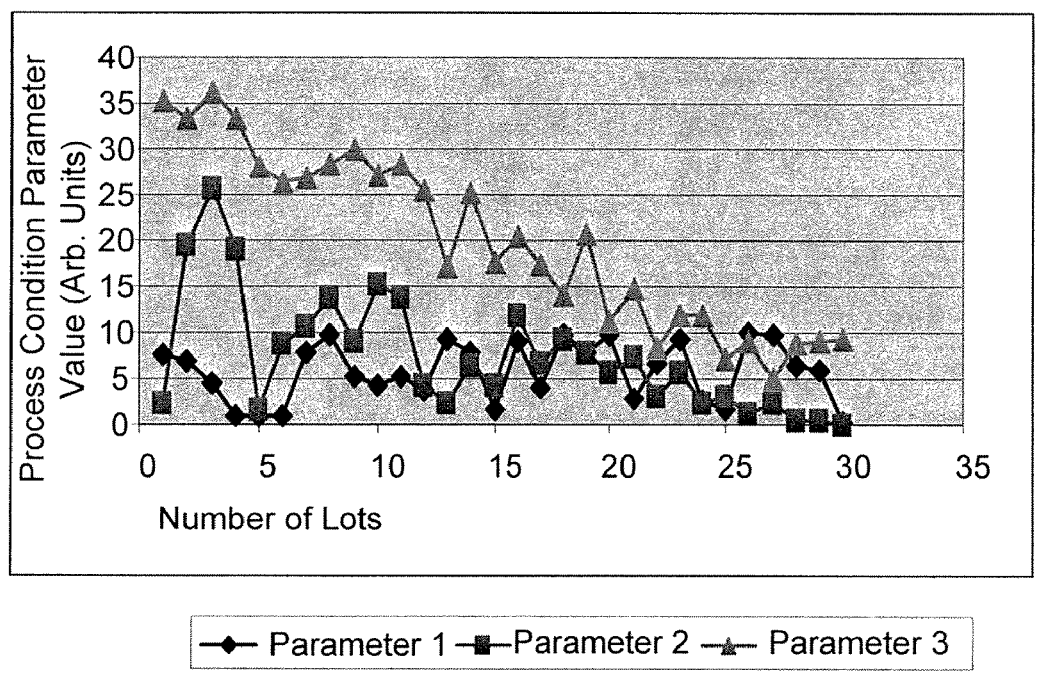
FIG. 12 is a chart showing values of process condition parameters vs. number of lots processed.

Using the signature patterns to determine changes in the process condition parameters can improve the effectiveness of advanced process control (APC) by correctly identifying the root cause of any observed CD measurement drift, thereby enabling the optimum exposure tool correction not just of the lot being measured, but of all subsequent lots of any product/layer combination processed on the same tool, as well as all subsequent lots of the same product/layer on other exposure tools. As shown in FIG. 12, statistical process control to be implemented on the process condition parameters themselves, not just on the measured metrics, thereby imposing tighter control and enabling earlier detection and correction of any drift in the process condition parameters. In FIG. 12, the process condition parameter values calculated from all lots of three different products shows a strong linear drift in Parameter 3 that needs to be corrected for all products, as well as a weaker and noisier drift in Parameter 2 that may require more measurement and possibly correction.

Using the signature patterns to determine changes in the process condition parameters also allows for routine comparison between the process condition parameter changes on multiple exposure tools by identifying which tools are most prone to drift and in need of maintenance, which tools are closest to their optimum operating conditions and should be given priority for processing the most critical lots, which tools are most closely matched to one another to facilitate processing similar product layers on the most closely matched tools, and which tools are operating most closely to the conditions used in establishing the OPC and RET models used to create the layouts for the different products, thereby facilitating the orderly flow of production lots to the tools that will pattern those lots as closely as possible to the design intent.

Using the signature patterns to determine changes in the process condition parameters is also useful in implementing an improved MBAPC control system by removing or eliminating the effects of reticle manufacturing variations from the lithography process control system. In a conventional APC or statistical process control (SPC) system, it is often observed that certain masks produce better CD distributions and/or a higher yield of high value chips when exposed on one particular exposure tool, while another mask may produce higher yield and/or value when exposed on a different exposure tool. Given the limited amount of data available on CD distributions on the mask, the limited data available on the full pattern transfer process across the exposure field, and the difficulty in determining exactly which patterns vary on the chips to make the chips produced by one tool perform better than those produced by another tool, it is usually not possible to determine why one mask/tool combination should perform better than another.

The lithography process simulation and metrology method using the signature patterns described herein can enable a better understanding of the contribution of mask variations to CD and yield performance, and thereby facilitate improved MBAPC control. By determining the variations not just in the CD distribution of the metrology targets but of the process condition parameters, using the signature patterns to determine changes in the process condition parameters allows for faster identification of specific masks where the performance of the mask in terms of CD distributions, CD behavior of specific features, or specific metrics of pattern transfer does not meet expectations. As an example, and by illustration only, assume that a series of masks is exposed on the same exposure tool in succession and the metrology results collected on a set of signature patterns which may or may not be common to the different masks, but signature patterns produce the same calculated changes in process condition parameters. If the changes in process condition parameters for one of the masks is noticeably different than the changes in process condition parameters for the other masks, given that there was little time for the exposure tool to drift between the exposures, this would serve as a quick and effective identification of a problem with the quality of the one mask with different changes in process condition parameters. More information could then be collected for that mask to determine if it should be used in production or not, and, if it is to be used, a full chip simulation could help identify mask specific offsets in the process condition parameters to be applied to the exposures using that mask to produce the optimum CD and pattern transfer performance at the wafer level.

Using the signature patterns to determine changes in the process condition parameters is especially useful for products that are processed on an infrequent basis. In a conventional process control system, these infrequent lots would be exposed using a time weighted average of the previous exposure doses used for the same product/layer on a given exposure tool, even though there may have been extensive changes to the tool since the last time a lot of that product/layer was processed. In more advanced approaches, the exposure dose may be adjusted based on the average change of all other recently processed lots of similar product/layers on the same tool. However, the choice of what constitutes a "similar" layer is often based on empirical results (a limited history showing similar CDs at similar times in the past), or a subjective sense on the part of the person directing the production flow or writing the rules for an automated flow control system. Often the creation of groups of "similar" product layers is determined based on the design rules or technology used for the particular design with no knowledge of how the mask manufacturing errors differ from mask to mask.

Using the signature patterns to determine changes in the process condition parameters can improve these process control approaches in a number of ways. First, the question of what constitutes a "similar" product/layer can be answered rigorously, not subjectively. Using the full chip simulation system and the signature patterns, incoming circuit designs could be analyzed and automatically rated on their sensitivity to variations of the different process condition parameters. Designs whose simulated metrics have similar sensitivities to the process condition parameters could be grouped together and SPC or APC control algorithms could be used to treat them as a group. In this manner, even if a particular mask that belongs to such a group is not used for a period of time, the optimum process conditions to use for that mask would still be known from the performance of the other members of the group. In addition, above and beyond the improvement obtained by better classification into similar groups, the corrections to be applied to the exposure tool would be greatly improved because the user could determine not just a time averaged exposure dose offset, but an exposure dose offset appropriate to the known changes in the full range of process condition parameters determined from all other products that had been processed since the last time the particular mask in question had been used. Thus, if a particular aberration of the projection lens or illumination system had been known to have drifted, a full chip simulation or a critical portion thereof could be quickly recomputed and new optimum settings of the adjustable process condition parameters can be determined based on the complete configuration of all of the process condition parameters.

The process condition parameters computed from measured changes in metrics associated with the signature patterns can also be used to feed forward corrections to an etch process or other subsequent process steps. For example, even if the measured and/or simulated CDs are within specification, if the slope of the resist features is incorrect due to focus offsets or other aberrations, the final width of the etched structure will be incorrect as well. Although an out-of-specification resist pattern on a wafer can be cleaned (stripped) and reworked, once the pattern is etched into the underlying layer, no further correction is possible, and the entire wafer, possibly even the entire wafer lot, may have lower than acceptable yield and may even need to be scrapped. For this reason, feed forward corrections to the etch process are very valuable.

The process condition parameters computed from measured changes in metrics associated with the signature patterns allow the lithography process control system to comprehend not just the resist CDs, but also how those CDs will transfer through the etch process. The correlation between focus and resist sidewall angle, and the correlation between resist sidewall angle and the final etched CD, is well known, and can be predicted by empirical lookup tables or models of the etch process that are well documented in the literature. The full chip simulation system disclosed in U.S. Pat. No. 7,003,758 and described below in conjunction with FIG. 13 is well suited to perform etch simulation as well as lithography simulation, and can be used to predict, optimize and adjust the etch process to deliver the optimum final etched CD distribution across the entire chip; or, failing to be able to correct the lithography process adequately, to signal an alarm and prevent the lot of wafers from being etched.

Figure 13:
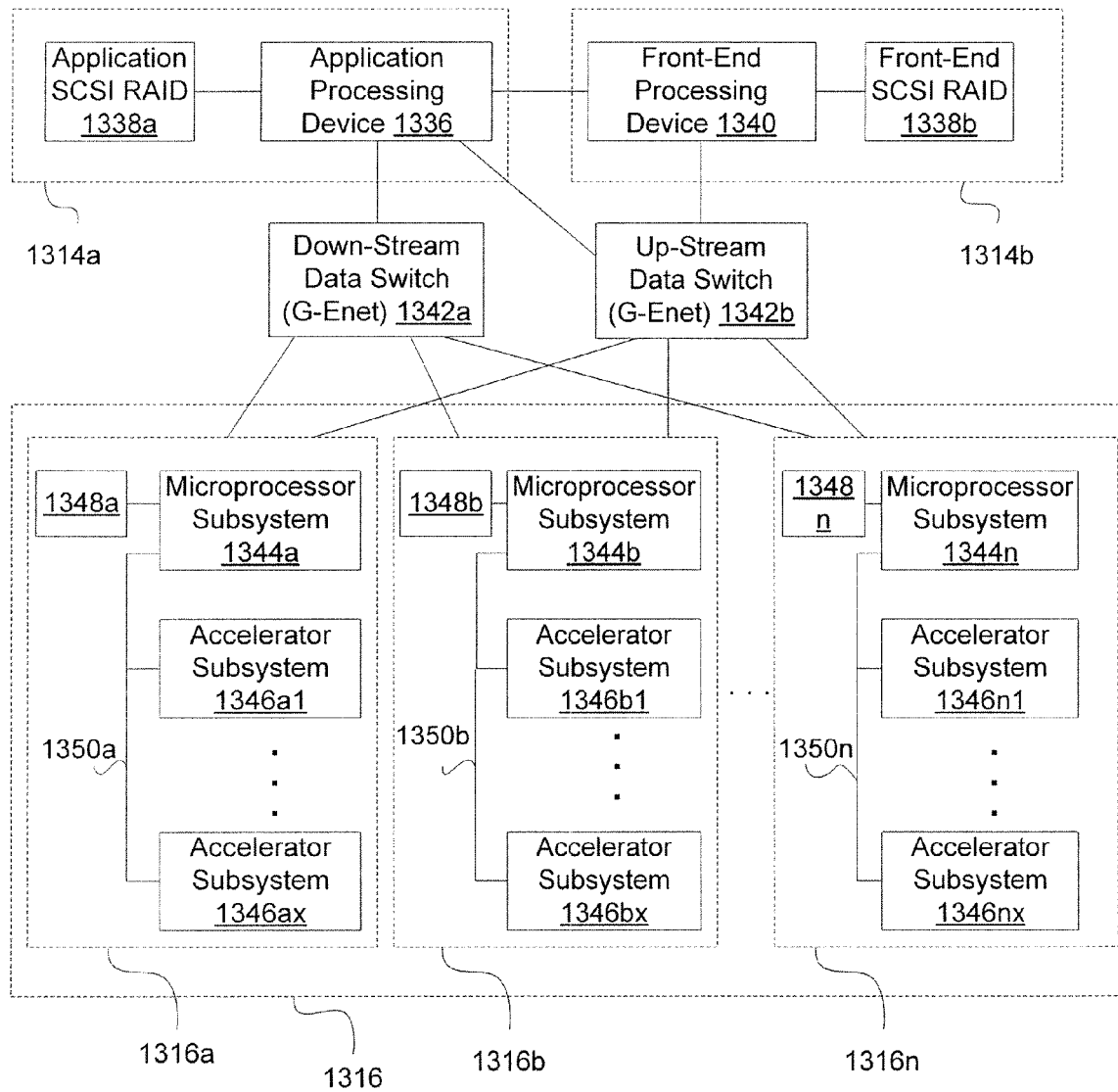
FIG. 13 is a diagram of one embodiment of a lithography simulation system, according to the invention.

FIG. 13 is a diagram of one embodiment of a lithography simulation system 1300, according to the invention. System 1300 includes, but is not limited to, one or more general purpose-type computing systems, including but not limited to, an application processing system 1314a and a front-end processing system 1314b. Application processing system 1314a is suitably configured to handle job management of the overall operations of system 1300. In particular, in one embodiment, application processing system 1314a includes an application processing device 1336 and an application SCSI RAID 1338a. Application processing device 1336 is suitably programmed to provide management of the operations of the various components of system 1300. In this regard, for example, application processing device 1336 may be programmed to partition a design database for the various components of an accelerator system 1316, thereby specifying the individual jobs, functions or processes performed by components of accelerator system 1316. Application SCSI RAID hard-disk array 1338a provides storage for the programs and data (for example, design database) used by application processing device 1336.

Front-end processing system 1314b includes a front-end processing device 1340 which is suitably programmed to handle or perform direct interaction with the user or operator (i.e., the "outside world") via, for example, client computer(s) (not illustrated) that provide operator or user access to system 1300 for job setup and/or results review/analysis. A front-end SCSI RAID hard-disk array 1338b, associated with front-end processing device 1340 should be a high capacity storage device, since front-end SCSI RAID 1338b is used to store results and images of many simulation jobs. Front-end processing system 1314b also communicates with application processing system 1314a, to provide or retrieve data to or from application SCSI RAID 1338a (for example, the design database), and instructs application processing system 1314a to start a job, as instructed by the user or operator.

Application processing system 1314a and front-end processing system 1314b connect with accelerator system 1316, for example, through high speed switches (for example, gigabit-Ethernet switches 1342a and 1342b). Switches 1342a and 1342b may be Dell 5224 Power Connect, manufactured and provided by Dell Computer (Austin, Tex., USA). The implementation and operation of the Dell 5224 Power Connect are described in detail in application notes, technical/journal articles and data sheets, all of which are incorporated by reference herein.

In one embodiment, all or substantially all of the actual computationally intensive tasks of lithography simulation may be conducted by accelerator system 1316, and, in particular, one or more accelerator components 1316a-n. This architecture allows scalable computation capacity, by changing the number of accelerator hardware components 1316a-n. Moreover, this architecture also enables or enhances overall fault-tolerance of system 1300. For example, should a given accelerator hardware component 1316a-n fail, its jobs may be re-assigned to the other accelerator hardware components 1316a-n, and, in this way, system 1300 maintains its operational condition/state.

In particular, accelerator system 1316 may include one or more accelerator components 1316a-n, each having one of microprocessor subsystem 1344a-n (including one or more microprocessors), one or more accelerator subsystems 1346a-n, and local or resident memory storage 1348a-n coupled to an associated microprocessor subsystem 1344a-n. The extent or amount of hardware acceleration capability may be balanced with microprocessor subsystems 1344a-n, depending on the extent or amount of computation to be performed.

In one embodiment, microprocessor subsystems 1344a-n each includes two Xeon microprocessors manufactured by Intel (Santa Clara, Calif., USA). The accelerator subsystems 1346a-n each includes a plurality of Application-Specific Integrated Circuit (ASIC), special-purpose DSP integrated circuits, and/or programmable gate arrays (for example, field-programmable gate arrays ("FPGAs")). In fact, each of accelerator subsystems 1346a-n may include multiple accelerator subsystems, for example, accelerator subsystem 1346a may include all the accelerator subsystems 1346a1-6ax, as illustrated in FIG. 13. In this way, when fully utilized, each of accelerator subsystems 1346a-n contains computational capacity of roughly twenty-five Xeon microprocessors.

A bus 1350a-n facilitates high-speed communication between microprocessor subsystem 1344a-n and associated accelerator subsystem(s) 1346a-n. The communication protocols and techniques on bus 1350a-n may be PCI, PCIX, or other high-speed communication protocols and techniques. Indeed, any high-speed technique, whether now known or later developed, may be implemented over bus 1350a-n. Notably, in one embodiment, the bus interface may be implemented using a 21P100BGC PCI-X bridge (64 bit/133 MHz) from International Business Machines Corporation (Armonk, N.Y., USA). The implementation and operation of the 21P100BGC are described in detail in application notes, technical/journal articles and data sheets, all of which are incorporated by reference herein.

In one embodiment, computations that are performed by be accelerator subsystems 1346a-n include, for example, anti-aliasing filtering and down-sampling, Fast Fourier Transforms for aerial image computation, image filtering and/or thresholding operations in resist modeling. The computations that are performed by microprocessor subsystems 1344a-n include, for example, polygon-to-binary bitmap conversion and application programs or processes (e.g., RET verification). The partitioning of computing tasks between microprocessor subsystem 1344a-n and accelerator subsystems 1346a-n is application-dependent and may vary from application to application or job to job.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method for identifying process window signature patterns, comprising:
   performing simulations of a lithography process, using a representation of a device area of a mask, at two or more non-nominal locations and at nominal condition in a process window to produce simulation results;
   determining simulated values from the simulation results for at least one metric at the two or more non-nominal locations and at nominal condition in the process window, wherein the simulated values for the at least one metric are determined at a plurality of locations within the device area;
   for each of the plurality of locations within the device area, determining a difference between simulated values for the at least one metric at the two or more non-nominal locations in the process window and the simulated value for the at least one metric at nominal condition;
   identifying a number of locations within the device area where the difference for the at least one metric is above a threshold;
   if the number of identified locations is greater than a predetermined number, modifying the threshold and identifying the locations within the device area where the difference for the at least one metric is above the threshold until the number of identified locations within the device area is less than the predetermined number; and
   assigning patterns associated with the number of identified locations within the device area that is less than the predetermined number to be signature patterns.

2. The method of claim 1, wherein the process window is defined by at least two process condition parameters of the lithography process.

3. The method of claim 2, wherein the at least two process condition parameters are focus and exposure dose.

4. The method of claim 2, wherein the at least two process condition parameters are selected from the group consisting of focus, exposure dose, numerical aperture, film stacks, lens aberrations, coherence, and illumination shifts.

5. The method of claim 1, further comprising:
   obtaining measured values of the at least one metric for the signature patterns, the measured values being obtained from measurements of the signature patterns printed on a wafer processed by the lithography process using the mask;
   finding a location in the process window where a total difference measure between the measured values of the at least one metric for all of the signature patterns and the simulated values of the at least one metric for all of the signature patterns at the location in the process window is minimized; and
   determining a change between the location in the process window where the total difference measure is minimized and nominal condition to determine a change in the lithography process.

6. A method for monitoring changes in a lithography process, comprising:
   performing simulations of a lithography process, using a representation of a device area of a mask, at two or more non-nominal locations and at nominal condition in a process window to produce simulation results;
   determining simulated values from the simulation results for at least one metric at the two or more non-nominal locations and at nominal condition in the process window, wherein the simulated values for the at least one metric are determined at a plurality of locations within the device area;
   for each of the plurality of locations within the device area, determining a difference between simulated values for the at least one metric at the two or more non-nominal locations in the process window and the simulated value for the at least one metric at nominal condition;
   identifying a number of locations within the device area where the difference for the at least one metric is above a threshold;
   if the number of locations is greater than a predetermined number, modifying the threshold and identifying the locations within the device area where the difference for the at least one metric is above the threshold until the number of identified locations within the device area is less than the predetermined number;
   assigning patterns associated with the number of identified locations within the device area that is less than the predetermined number to be signature patterns;
   obtaining measured values of the at least one metric for the signature patterns, the measured values being obtained from measurements of the signature patterns printed on a wafer processed by the lithography process using the mask;
   finding a location in the process window where a total difference measure between the measured values of the at least one metric for all of the signature patterns and the simulated values of the at least one metric for all of the signature patterns at the location in the process window is minimized; and
   determining a change between the location in the process window where the total difference measure is minimized and nominal condition to determine a change in the lithography process.

7. The method of claim 6, further comprising:
correlating the change in the lithography process with a wafer chip yield map using statistical analysis.

8. The method of claim 6, further comprising:
inputting the change in the lithography process to a lithography process control system.

9. The method of claim 6, further comprising:
providing the change in the lithography process to a model-based advanced process control system.

10. The method of claim 6, wherein the process window is defined by at least two process condition parameters of the lithography process.

11. The method of claim 10, wherein the at least two process condition parameters are focus and exposure dose.

12. The method of claim 10, wherein the at least two process condition parameters are selected from the group consisting of focus, exposure dose, numerical aperture, film stacks, lens aberrations, and illumination shifts.

13. A method for identifying deviations from nominal values of process condition parameters of a lithography process, comprising:
processing a wafer using a lithography process and a mask;
measuring a metric associated with each of a plurality of signature patterns of a device area of the mask on the processed wafer, producing measured values of the metrics, wherein the plurality of signature patterns collectively provide a unique response to changes in a set of process condition parameters to the lithography process;
simulating the lithography process using a representation of the device area of the mask at a plurality of values of the set of process condition parameters to produce simulated results;
determining simulated values for each metric associated with each of the plurality of signature patterns of the device area of the mask using the simulated results;
identifying a location in the process window such that a total difference measure between the measured values for the metrics and the simulated values for the metrics is minimized; and
determining a deviation between the location in the process window where the total difference measure is minimized and nominal condition.

14. The method of claim 13, further comprising:
correlating the deviation between the location in the process window where the total difference measure is minimized and nominal condition with a wafer chip yield map using statistical analysis.

15. The method of claim 13, wherein the deviation between the location in the process where the total difference measure is minimized and nominal condition is used to correct the lithography process.

16. The method of claim 13, further comprising:
providing the deviation between the location in the process window where the total difference measure is minimized and nominal condition to a model-based advanced process control system.

17. The method of claim 13, wherein the deviation between the location in the process where the total difference measure is minimized and nominal condition is used to optimize an etch process for the processed wafer.

18. The method of claim 13, wherein the set of process condition parameters include focus and exposure dose.

19. The method of claim 13, wherein the set of process condition parameters is selected from the group consisting of focus, exposure dose, numerical aperture, film stacks, lens aberrations, coherence, and illumination shifts.

20. A computer-readable medium including instructions for performing:
performing simulations of a lithography process, using a representation of a device area of a mask, at two or more non-nominal locations and at nominal condition in a process window to produce simulation results;
determining simulated values from the simulation results for at least one metric at the two or more non-nominal locations and at nominal condition in the process window, wherein the simulated values for the at least one metric are determined at a plurality of locations within the device area;
for each of the plurality of locations within the device area, determining a difference between simulated values for the at least one metric at the two or more non-nominal locations in the process window and the simulated value for the at least one metric at nominal condition;
identifying a number of locations within the device area where the difference for the at least one metric is above a threshold;
if the number of locations is greater than a predetermined number, modifying the threshold and identifying the locations within the device area where the difference for the at least one metric is above the threshold until the number of identified locations within the device area is less than the predetermined number;
assigning patterns associated with the number of identified locations within the device area that is less than the predetermined number to be signature patterns;
storing measured values of the at least one metric for the signature patterns, the measured values being obtained from measurements of the signature patterns printed on a wafer processed by the lithography process using the mask;
finding a location in the process window where a total difference measure between the measured values of the at least one metric for all of the signature patterns and the simulated values of the at least one metric for all of the signature patterns at the location in the process window is minimized; and
determining a change between the location in the process window where the total difference measure is minimized and nominal condition to determine a change in the lithography process.

21. The computer-readable medium of claim 20, further comprising:
providing the change in the lithography process to an exposure tool that performs the lithography process.

22. The computer-readable medium of claim 20, further comprising:
providing the change in the lithography process to an etch process.

23. The computer-readable medium of claim 20, further comprising:
correlating the change in the lithography process with a wafer chip yield map using statistical analysis.

24. The computer-readable medium of claim 20, further comprising:
providing the change in the lithography process to a model-based advanced process control system.

25. The computer-readable medium of claim 20, wherein the set of process condition parameters include focus and exposure dose.

26. The computer-readable medium of claim 20, wherein the set of process condition parameters is selected from the group consisting of focus, exposure dose, numerical aperture, film stacks, lens aberrations, coherence, and illumination shifts.

* * * * *